US009491858B2

(12) United States Patent
Endo et al.

(10) Patent No.: US 9,491,858 B2
(45) Date of Patent: Nov. 8, 2016

(54) CIRCUIT BOARD

(71) Applicant: FUJIFILM Corporation, Tokyo (JP)

(72) Inventors: Yasushi Endo, Kanagawa-Ken (JP);
Nobuyuki Tada, Kanagawa-Ken (JP);
Kenji Naoi, Kanagawa-Ken (JP);
Tomohito Asai, Kanagawa-Ken (JP);
Hideo Ikeda, Kanagawa-Ken (JP);
Michihiro Shibata, Kanagawa-Ken (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 14/864,895

(22) Filed: Sep. 25, 2015

(65) Prior Publication Data

US 2016/0014894 A1  Jan. 14, 2016

Related U.S. Application Data

(63) Continuation of application No. PCT/JP2014/058437, filed on Mar. 26, 2014.

(30) Foreign Application Priority Data

Mar. 29, 2013 (JP) ................. 2013-072959

(51) Int. Cl.
*H05K 1/09* (2006.01)
*H05K 1/11* (2006.01)
(Continued)

(52) U.S. Cl.
CPC ............... *H05K 1/11* (2013.01); *C08F 220/18* (2013.01); *C09J 133/08* (2013.01); *C09J 133/10* (2013.01);
(Continued)

(58) Field of Classification Search
CPC ............ A61N 1/00; A61N 1/05; A61N 1/34; A61N 1/36; B04B 7/02; B04B 7/12; C12N 13/00
USPC .......... 174/257; 607/27, 46, 49, 59, 62, 119; 361/88; 205/701
See application file for complete search history.

(56) References Cited

U.S. PATENT DOCUMENTS 3,475,684 A * 10/1969 Covill ................. H04B 7/12
                                                       375/228
5,861,017 A *  1/1999 Smith ................ A61N 1/36003
                                                       607/49

(Continued)

FOREIGN PATENT DOCUMENTS

| JP | 2006-039927 | 2/2006 |
|---|---|---|
| JP | 2011-501767 | 1/2011 |
| JP | 2011-221949 | 11/2011 |
| JP | 2013-105327 | 5/2013 |

OTHER PUBLICATIONS

"International Search Report (Form PCT/ISA/210)" of PCT/JP2014/058437, mailed on Jun. 10, 2014.

*Primary Examiner* — Xiaoliang Chen
(74) *Attorney, Agent, or Firm* — Jianq Chyun IP Office

(57) ABSTRACT

This wiring board is provided with: a plurality of metal wires disposed upon an insulating substrate; and a transparent adhesive agent layer which is disposed upon the metal wires, and which is in direct contact with the metal wires. The metal wires include: a first metal wire which has a pulse signal supplied thereto; and a second metal wire which has a fixed electric potential applied thereto. The pulse signal has a reference level identical to the fixed electric potential, and has a pulse train in which a plurality of pulses having a pulse width of not more than 3 msec are arranged, the integral time of the pulses in a period of 600 seconds being less than 60 seconds.

11 Claims, 10 Drawing Sheets

(51) Int. Cl.
*C09J 133/26* (2006.01)
*C08F 220/18* (2006.01)
*C09J 133/08* (2006.01)
*C09J 133/10* (2006.01)
*H05K 1/02* (2006.01)
*H05K 3/28* (2006.01)
*G06F 3/044* (2006.01)
*H05K 3/46* (2006.01)

(52) U.S. Cl.
CPC .............. *C09J 133/26* (2013.01); *G06F 3/044* (2013.01); *H05K 1/0289* (2013.01); *H05K 1/092* (2013.01); *H05K 3/285* (2013.01); *G06F 2203/04103* (2013.01); *G06F 2203/04112* (2013.01); *H05K 3/4673* (2013.01); *H05K 2201/0108* (2013.01); *H05K 2201/0761* (2013.01); *H05K 2201/0769* (2013.01)

(56) References Cited

U.S. PATENT DOCUMENTS

| | | | | |
|---|---|---|---|---|
| 5,983,140 | A * | 11/1999 | Smith | A61N 1/36003 607/49 |
| 6,010,613 | A * | 1/2000 | Walters | C12M 35/02 205/701 |
| 6,078,490 | A * | 6/2000 | Walters | C12N 13/00 323/220 |
| 6,424,868 | B1 * | 7/2002 | Smith | A61N 1/36003 607/49 |
| 6,829,509 | B1 * | 12/2004 | MacDonald | A61N 1/056 600/374 |
| 2002/0128689 | A1 * | 9/2002 | Connelly | A61N 1/056 607/27 |
| 2009/0087629 | A1 | 4/2009 | Everaerts et al. | |
| 2009/0157141 | A1 * | 6/2009 | Chiao | A61N 1/36071 607/46 |
| 2011/0254805 | A1 | 10/2011 | Tanimizu et al. | |
| 2013/0120312 | A1 | 5/2013 | Takahashi et al. | |

* cited by examiner

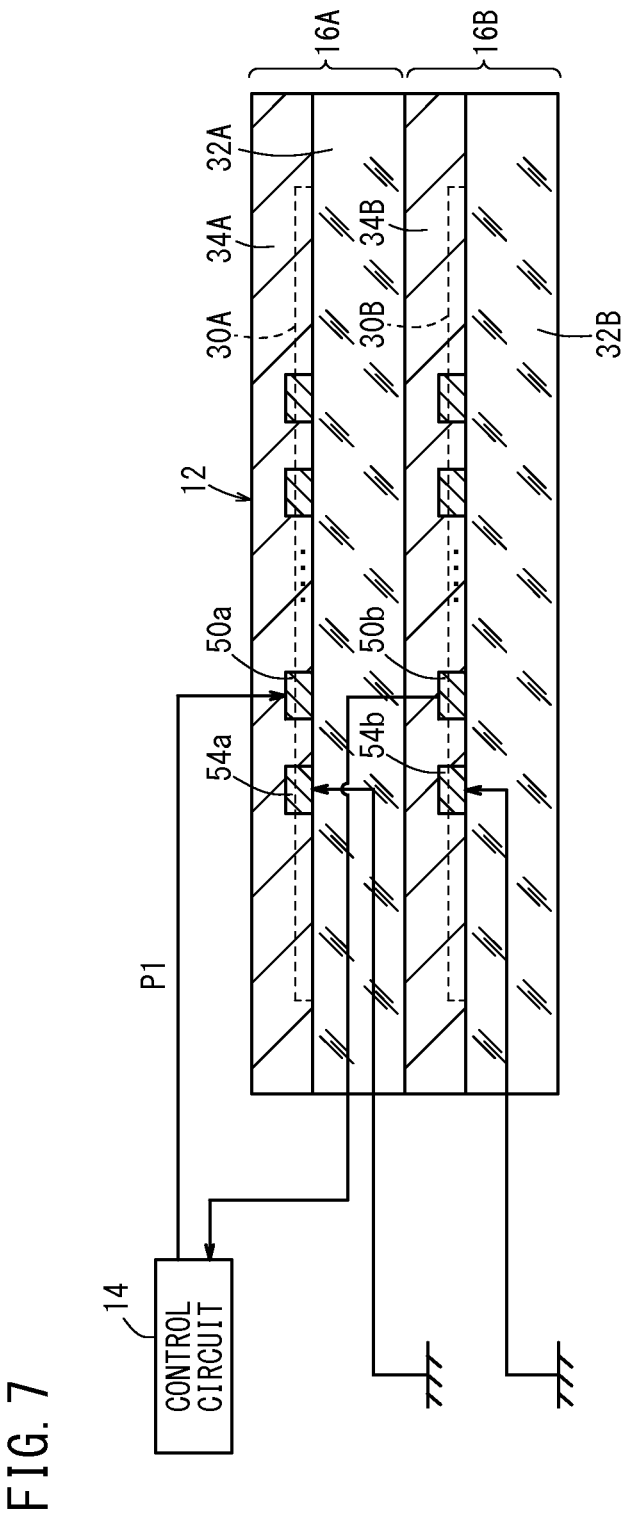

CIRCUIT BOARD

CROSS-REFERENCE TO RELATED APPLICATIONS AND PRIORITY CLAIMS

This application is a Continuation of International Application No. PCT/JP2014/058437 filed on Mar. 26, 2014, which was published under PCT Article 21(2) in Japanese, which is based upon and claims the benefit of priority from Japanese Patent Application No. 2013-072959 filed on Mar. 29, 2013, the contents all of which are incorporated herein by reference.

TECHNICAL FIELD

The present invention relates to a circuit board and more particularly to a circuit board in which ion migration between interconnects is taken into account.

BACKGROUND ART

Recently, there has been known a circuit board in which an optically transparent pressure-sensitive adhesive compound is held in direct contact with transparent electroconductive interconnects containing indium tin oxide (ITO) (see, Japanese Laid-Open Patent Publication No. 2011-501767 (PCT)). Japanese Laid-Open Patent Publication No. 2011-501767 (PCT) discloses an embodiment in which the surface resistance of the transparent electroconductive interconnects that are stored in a prescribed environment (at a temperature of 60° C. and a relative humidity of 90%) for 30 to 40 days is prevented from increasing by selecting constituent materials of the transparent adhesive.

SUMMARY OF INVENTION

Recent years have seen the ongoing miniaturization of semiconductor integrated circuits, chip components, etc. For example, peripheral circuits and interconnects of touch panels have been reduced in size as much as possible, and metal lead-out interconnects such as terminal interconnects or the like have been micronized. Therefore, the widths of metal lead-out interconnects and the distances between the interconnects on circuit boards have been made smaller, tending to cause circuit disconnections and short circuits between interconnects due to ion migration. In particular, highly electroconductive silver and copper are widely used as metals of which metal lead-out interconnects are made up, but these metals are problematic in that they are likely to give rise to ion migration. Especially, this problem manifests itself in silver.

As described above, Japanese Laid-Open Patent Publication No. 2011-501767 (PCT) discloses a combination of the transparent electroconductive interconnects and the transparent adhesive. However, the document is only aimed at suppressing a change in the resistance of the transparent electroconductive interconnects at the time they are stored for a long period of time in the prescribed environment. In the context of the ongoing miniaturization of metal lead-out interconnects in attempts to make components smaller in size in recent years, however, the disclosed circuit board is not sufficient to prevent disconnections due to ion migration between metal interconnects and also short circuits between interconnects.

In other words, the background art has failed to satisfy the required level of suppression of ion migration and needs to be improved further.

The present invention has been made in view of the above drawbacks. It is an object of the present invention to provide a circuit board which offers the following advantages:

(a) To be able to effectively reduce the potential difference between metal lead-out interconnects;

(b) To be able to suppress the development of ion migration between metal lead-out interconnects that are made of silver, copper, or the like; and (c) To be able to promote further the miniaturization of the circuit board, the micronization of interconnects, and the reduction in the distances between interconnects.

[1] A circuit board according to the present invention has a plurality of metal interconnects disposed on an insulating base and a transparent adhesive layer disposed on the metal interconnects in direct contact with the metal interconnects, wherein the metal interconnects include first metal interconnects to which a pulse signal is supplied, and second metal interconnects to which a fixed potential is applied, and the pulse signal has a pulse train of a plurality of pulses whose reference level is the same as the fixed potential and which have a pulse duration of 3 milliseconds or shorter, and an integrated time of the pulses during 600 seconds is less than 60 seconds.

With this arrangement, the potential difference between the first metal interconnects and the second metal interconnects is reduced. As a result, even on the condition the first metal interconnects and the second metal interconnects are made of silver, copper, or the like, the development of ion migration between the interconnects is suppressed.

This leads to controlling the mobility and displacement of metal ions in the first metal interconnects. Specifically, the displacement of metal ions toward the ground potential due to the application of pulses and the displacement of metal ions to the first metal interconnects during the periods of the reference level are controlled for thereby controlling oxidation/reduction of the metal ions, with the result that the development of ion migration is assumed to be suppressed.

[2] In the present invention, the metal interconnects may contain at least one of silver and copper.

[3] In the present invention, the pulse signal may have a signal form in which the pulse train is output at a constant pulse period repeated during 600 seconds, and have a duty ratio (pulse duration/pulse period) of less than 10%. With this arrangement, the potential difference between the first metal interconnects and the second metal interconnects is reduced for an advantage in suppressing migration between the interconnects.

[4] In the present invention, the pulse signal may have a pulse train output period in which the pulse train is output and an idle time in which the fixed potential is continuously output during 600 seconds, and on condition it is assumed that 600 seconds represent a pulse period and the integrated time of the pulses of the pulse train represents a pulse duration, then the duty ratio (pulse duration/pulse period) may be less than 10%. With this arrangement, the potential difference between the first metal interconnects and the second metal interconnects is also reduced for an advantage in suppressing migration between the interconnects.

[5] In the present invention, the transparent adhesive layer may have a transparent adhesive made of at least one selected from a group consisting of a component A, a component B, and a component C, described below, which are optically transparent, and on condition the transparent adhesive is 100 parts, then the transparent adhesive contains 45 to 95 parts of the component A, 20 to 50 parts of the component B, and 1 to 40 parts of the component C;

component A: An alkyl (meth)acrylate monomer whose glass transition temperature $T_g$ is 25° C. or lower (the alkyl group has 4 through 18 carbon atoms);

component B: An ester of (meth)acrylate monomer whose glass transition temperature $T_g$ is 25° C. or higher; and component C: A monomer selected from a group of hydroxyalkyl (meth)acrylate, unsubstituted (meth)acrylamide, N-alkyl-substituted (meth)acrylamide, N,N-dialkyl-substituted (meth)acrylamide, a monomer having a urea functional group, and a monomer having a lactam functional group, a tertiary amine, an alicyclic amine, an aromatic amine, or a combination of these materials.

[6] The component A may be at least one selected from a group consisting of n-butyl acrylate, 2-ethyl-hexyl (meth) acrylate, isooctyl acrylate, 2-methylhexyl acrylate, and a combination thereof.

[7] The component B may be at least one selected from a group consisting of methyl (meth)acrylate, ethyl (meth) acrylate, isobornyl (meth)acrylate, and a combination thereof.

[8] The component C may be at least one selected from a group consisting of 2-hydroxyethyl (meth)acrylate, 3-hydroxypropyl (meth)acrylate, N-octylacrylamide, N,N-dimethylacrylamide, N,N-diethylacrylamide, vinylpyridine, vinylimidazole, and N,N-dialkylaminoalkyl (meth)acrylate (the alkyl group has 1 through 4 carbon atoms).

[9] The component A should preferably be 2-ethyl-hexyl (meth)acrylate, the component B should preferably be isobornyl (meth)acrylate, and the component C should preferably be 2-hydroxyethyl (meth)acrylate.

[10] Particularly, the transparent adhesive should preferably contain 50 to 65 parts of 2-ethyl-hexyl (meth)acrylate as the component A, 15 to 30 parts of isobornyl (meth) acrylate as the component B, and 20 to 30 parts of 2-hydroxyethyl (meth)acrylate as the component C. This increases the whitening resistance capability of the transparent adhesive layer.

[11] Alternatively, the component A may be n-butyl acrylate and the component C may be 2-hydroxyethyl (meth)acrylate. This also increases the whitening resistance capability of the transparent adhesive layer.

As described above, the circuit board according to the present invention offers the following advantages:

(a) The potential difference between the interconnects can be effectively reduced.

(b) The development of ion migration between the interconnects that are made of silver, copper, or the like can be suppressed.

(c) The miniaturization of the circuit board, the micronization of the interconnects, and the reduction in the distances between interconnects are further promoted.

The above and other objects, features, and advantages of the present invention will become apparent from the following description of the preferred embodiments when taken in conjunction with the accompanying drawings.

BRIEF DESCRIPTION OF DRAWINGS

FIG. 7 is a view showing an example of cross-sectional structure of the laminated electroconductive film and a control system (mutual capacitance process);

DESCRIPTION OF EMBODIMENTS

An embodiment wherein a circuit board (wiring board) according to the present invention is applied to a touch panel, for example, will be described below with reference to FIGS. 1 through 10B. The symbol "-(to)" used to represent numerical ranges in the description below shall be interpreted as including numerical values that represent the upper and lower limits of the numerical ranges.

Figure 1:
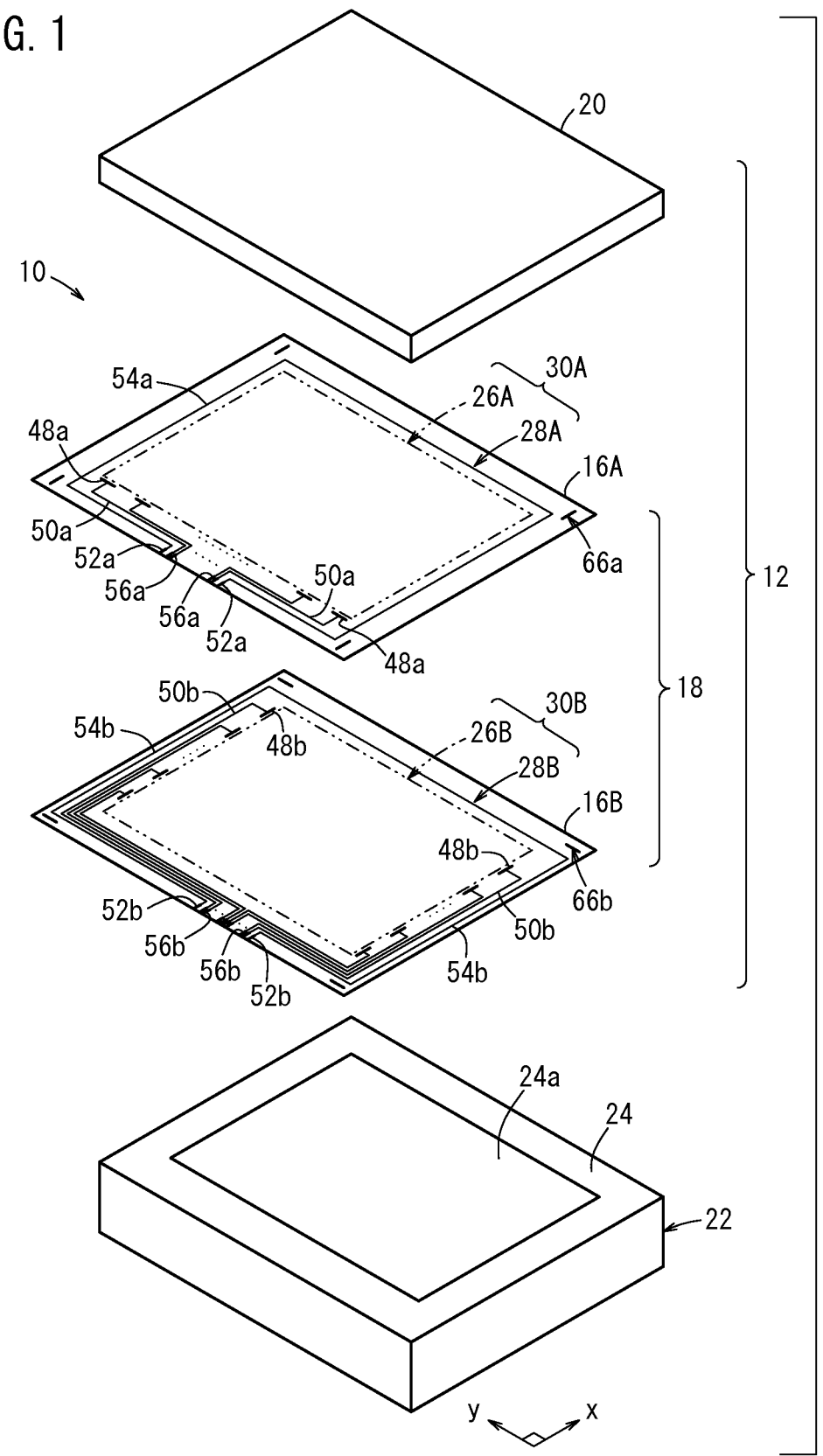
FIG. 1 is an exploded perspective view of a circuit board according to an embodiment of the present invention, as applied to a touch panel.
Figure 3:
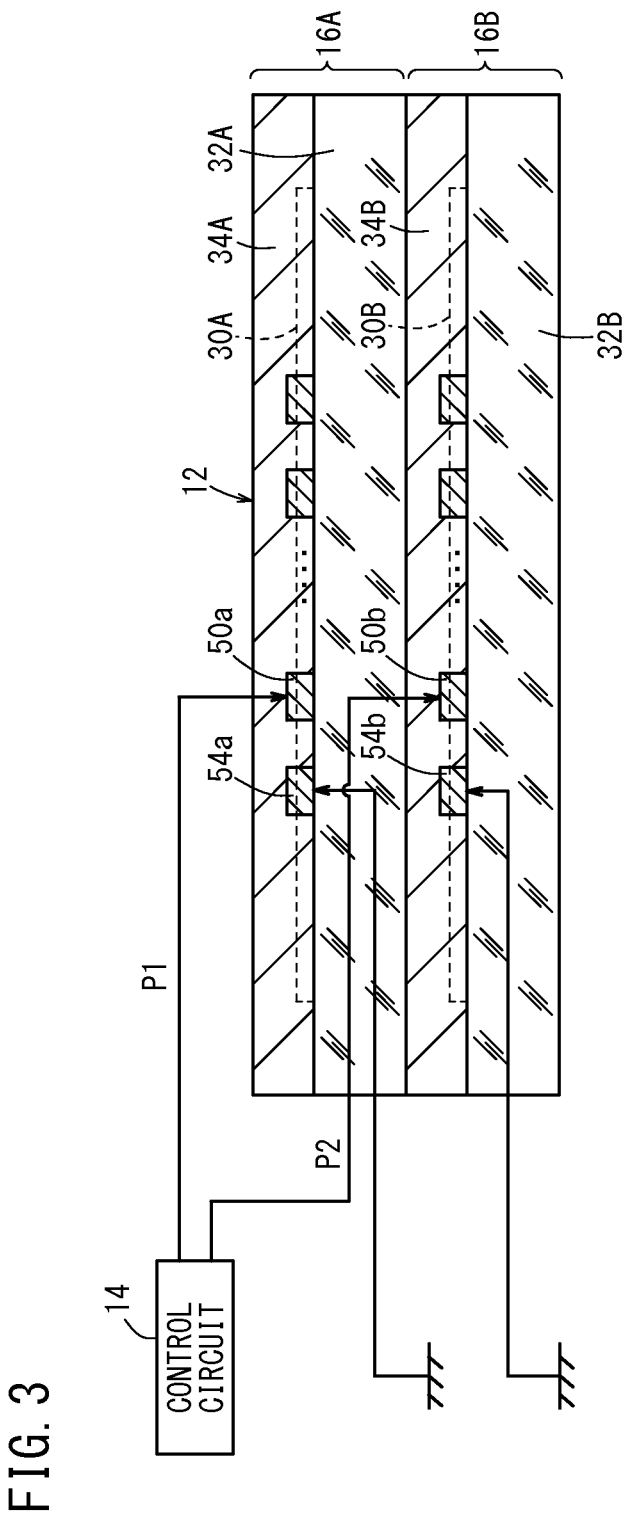
FIG. 3 is a view showing an example of cross-sectional structure of the laminated electroconductive film and a control system (self capacitance process)

As shown in FIG. 1, a touch panel 10 to which a circuit board according to the present embodiment is applied has a main sensor assembly 12 and a control circuit 14 (IC or the like: see FIG. 3). The main sensor assembly 12 includes a laminated electroconductive film assembly 18 made up of a first electroconductive film 16A (circuit board) and a second electroconductive film 16B (circuit board) that are stacked together, and a protective layer 20 stacked on the laminated electroconductive film assembly 18. The laminated electroconductive film assembly 18 and the protective layer 20 are disposed on a display panel 24 of a display device 22 such as a liquid crystal display or the like, for example. The first electroconductive film 16A and the second electroconductive film 16B as viewed from above have a first sensor area 26A and a second sensor area 26B positioned in alignment with a display screen 24a of the display panel 24, and a first terminal interconnect area 28A and a second terminal interconnect area 28B (so-called frames) disposed in alignment with an outer peripheral region of the display panel 24. The first sensor area 26A and the first terminal interconnect area 28A jointly make up a first electroconductive section 30A, and the second sensor area 26B and the second terminal interconnect area 28B jointly make up a second electroconductive section 30B.

Figure 2:
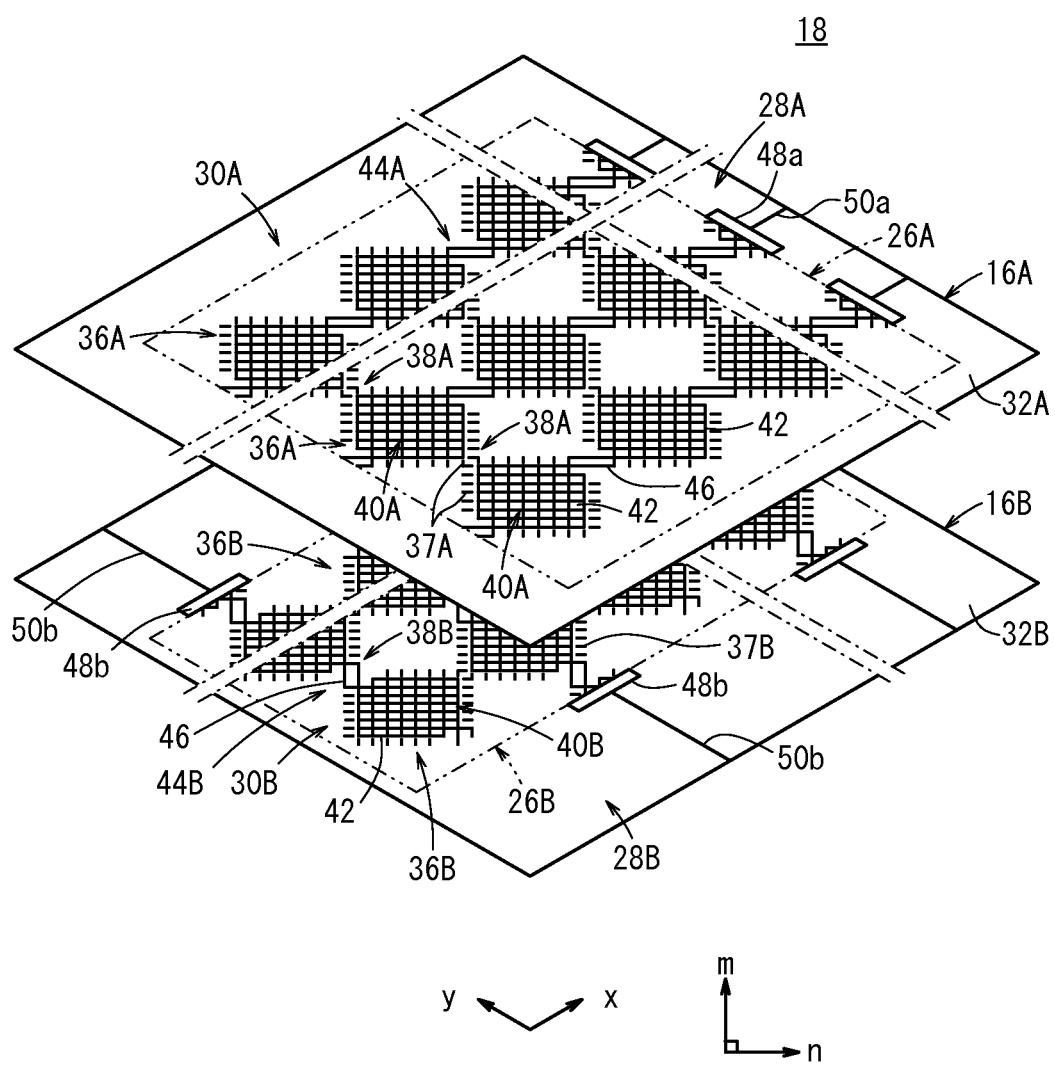
FIG. 2 is an exploded perspective view of a laminated electroconductive film (circuit board)

As shown in FIGS. 2 and 3, the first electroconductive film 16A has a first transparent base 32A, the first electroconductive section 30A disposed on the surface of the first transparent base 32A, and a first transparent adhesive layer 34A (see FIG. 3) disposed in covering relation to the first electroconductive section 30A.

As shown in FIG. 2, the first sensor area 26A has a plurality of first electroconductive patterns 36A of a transparent electroconductive layer comprising thin metal lines, and a plurality of first auxiliary patterns 38A comprising a plurality of first auxiliary lines 37A disposed around each of the first electroconductive patterns 36A. The first electroconductive patterns 36A extend in a first direction (x direction) and are arrayed in a second direction (y direction) perpendicular to the first direction.

Specifically, the first electroconductive patterns 36A are in the form of two or more first large grids 40A connected in series along the first direction. Each of the first large grids 40A comprises a combination of two or more small grids 42. The first auxiliary patterns 38A are disposed around the sides of the first large grids 40A, but are not connected to the first large grids 40A.

A first connector 44A is disposed between adjacent ones of the first large grids 40A and electrically connects them to each other. It is assumed that a direction which bisects the space between the first direction and the second direction is referred to as a third direction (m direction), and a direction perpendicular to the third direction as a fourth direction (n direction). The first connector 44A comprises a medium grid 46 that is as large as p (a real number greater than 1) small grids 42 arrayed in the fourth direction (n direction).

Each of the small grids 42 is of a square shape which is the smallest of all the grids. The medium grid 46 is as large as three small grids 42 arrayed in one direction.

As shown in FIG. 2, the first electroconductive film 16A arranged as described above is of such a shape that no first connectors 44A exist at the open ends of the first large grids 40A which are present at one end portions of the respective first electroconductive patterns 36A. The ends of the first large grids 40A which are present at the other end portions of the respective first electroconductive patterns 36A are electrically connected to first terminal interconnect patterns 50a in the form of metal interconnects (wiring) by first couplers 48a.

In other words, as shown in FIG. 2, the first electroconductive film 16A applied to the touch panel 10 includes the above many first electroconductive patterns 36A arrayed in a portion corresponding to the first sensor area 26A. The plural first terminal interconnect patterns 50a (first metal interconnects) that extend from the first couplers 48a are arrayed in the first terminal interconnect area 28A. A first ground line 54a (second metal interconnect) for achieving a shielding effect extends outside the first terminal interconnect patterns 50a from a first ground terminal 52a to another first ground terminal 52a in surrounding relation to the first sensor area 26A.

In the example shown in FIG. 1, the first electroconductive film 16A has an outer profile which is of a rectangular shape as viewed in plan, and the first sensor area 26A also has an outer profile which is of a rectangular shape. On a longitudinally central portion of a peripheral edge of the first terminal interconnect area 28A on one longer side of the first electroconductive film 16A, there are arrayed, in addition to the above pair of first ground terminals 52a, a plurality of first connection terminals 56a along a longitudinal direction of the longer side of the first electroconductive film 16A. The plural first couplers 48a are linearly arrayed along a longer side of the first sensor area 26A (longer side closest to the longer side of the first electroconductive film 16A: y direction). The first terminal interconnect patterns 50a that extend from the respective first couplers 48a extend toward a substantially central region of the longer side of the first electroconductive film 16A and are electrically connected to the corresponding first connection terminals 56a.

Therefore, as shown in FIG. 3, the first transparent adhesive layer 34A that is disposed in covering relation to the first electroconductive section 30A is held in contact with the first terminal interconnect patterns 50a (first metal interconnects) and the first ground line 54a (second metal interconnect) of the first terminal interconnect area 28A and the first electroconductive patterns 36A (transparent electroconductive layer), and is disposed on the first metal interconnects, the second metal interconnect, and the transparent electroconductive layer.

As shown in FIGS. 2 and 3, the second electroconductive film 16B has a second transparent base 32B, the second electroconductive section 30B disposed on the surface of the second transparent base 32B, and a second transparent adhesive layer 34B (see FIG. 3) disposed in covering relation to the second electroconductive section 30B.

The second sensor area 26B has a plurality of second electroconductive patterns 36B of a transparent electroconductive layer comprising thin metal lines, and a plurality of second auxiliary patterns 38B comprising a plurality of second auxiliary lines 37B disposed around each of the second electroconductive patterns 36B. The second electroconductive patterns 36B extend in the second direction (y direction) and are arrayed in the first direction (x direction).

Specifically, the second electroconductive patterns 36B are in the form of two or more second large grids 40B connected in series along the second direction. Each of the second large grids 40B comprises a combination of two or more small grids 42. The second auxiliary patterns 38B are disposed around the sides of the second large grids 40B, but are not connected to the second large grids 40B.

A second connector 44B is disposed between adjacent ones of the second large grids 40B and electrically connects them to each other. The second connector 44B comprises a medium grid 46 that is as large as p small grids 42 arrayed in the third direction (m direction).

The second electroconductive film 16B arranged as described above is of such a shape that no second connectors 44B exist at the open ends of the second large grids 40B which are present at one end portions of the respective second electroconductive patterns 36B. The ends of the second large grids 40B which are present at the other end portions of the respective odd-numbered second electroconductive patterns 36B and the ends of the second large grids 40B which are present at one end portions of the respective even-numbered second electroconductive patterns 36B are electrically connected to second terminal interconnect patterns 50b in the form of metal interconnects by second couplers 48b.

In other words, as shown in FIGS. 1 and 2, the second electroconductive film 16B applied to the touch panel 10 includes the many second electroconductive patterns 36B arrayed in a portion corresponding to the second sensor area 26B. The plural second terminal interconnect patterns 50b (first metal interconnects) that extend from the second couplers 48b are arrayed in the second terminal interconnect area 28B. A second ground line 54b (second metal interconnect) for achieving a shielding effect extends outside the second terminal interconnect patterns 50b from a second ground terminal 52b to another second ground terminal 52b in surrounding relation to the second sensor area 26B.

As shown in FIG. 1, on a longitudinally central portion of a peripheral edge of the second terminal interconnect area 28B on a longer side of the second electroconductive film 16B, there are arrayed, in addition to the above pair of second ground terminals 52b, a plurality of second connection terminals 56b along a longitudinal direction of the longer side of the second electroconductive film 16B. The plural second couplers 48b (e.g., the odd-numbered second couplers 48b) are linearly arrayed along one shorter side of the second sensor area 26B (shorter side closest to one shorter side of the second electroconductive film 16B: x direction). The plural second couplers 48b (e.g., the even-numbered second couplers 48b) are linearly arrayed along the other shorter side of the second sensor area 26B (shorter side closest to the other shorter side of the second electroconductive film 16B: x direction).

Of the second electroconductive patterns 36B, the odd-numbered second electroconductive patterns 36B, for example, are connected to the corresponding odd-numbered second couplers 48b, and the even-numbered second electroconductive patterns 36B are connected to the corresponding even-numbered second couplers 48b. The second terminal interconnect patterns 50b that extend from the odd-numbered and even-numbered second couplers 48b extend toward a substantially central region of one longer side of the second electroconductive film 16B and are electrically connected to the corresponding second connection terminals 56b.

The manner in which the first terminal interconnect patterns 50a extend may be the same as with the second terminal interconnect patterns 50b, and the manner in which the second terminal interconnect patterns 50b extend may be the same as with the first terminal interconnect patterns 50a.

Therefore, the second transparent adhesive layer 34B that is disposed in covering relation to the second electroconductive section 30B is also held in contact with the second terminal interconnect patterns 50b (first metal interconnects) and the second ground line 54b (second metal interconnect) of the second terminal interconnect area 28B and the second electroconductive patterns 36B (transparent electroconductive layer), and is disposed on the first metal interconnects, the second metal interconnect, and the transparent electroconductive layer.

The thin metal lines that make up the first metal interconnects, the second metal interconnect, and the transparent electroconductive layer contain at least one of silver and copper.

The length of one side of the first large grids 40A and the second large grids 40B should preferably be in the range of 3 to 10 mm and more preferably be in the range of 4 to 6 mm. On the condition the length of one side is smaller than the above lower limit value, then since the electrostatic capacitance of the first large grids 40A and the second large grids 40B upon detection is reduced, the possibility of a detection failure is high. On the other hand, on the condition the length of one side exceeds the above upper limit value, then the accuracy of positional detection is likely to be lowered. From the same standpoint, the length of one side of the small grids 42 that make up the first large grids 40A and the second large grids 40B should preferably be in the range of 50 to 500 µm and more preferably be in the range of 150 to 300 µm. On the condition the small grids 42 fall in the above range, then it is possible to keep the transparency good, so that in a case where the circuit board is applied to the display panel 24 of the display device 22, it allows the viewer to visually recognize displayed information without a sense of incongruity.

The line width of the first electroconductive patterns 36A (the first large grids 40A, the medium grids 46), the line width of the second electroconductive patterns 36B (the second large grids 40B, the medium grids 46), and the line width of the first auxiliary patterns 38A (the first auxiliary lines 37A) and the second auxiliary patterns 38B (the second auxiliary lines 37B) are in the range of 1 to 9 µm each. The line width of the first auxiliary patterns 38A and the second auxiliary patterns 38B may be the same as or different from either one or both of the line width of the first electroconductive patterns 36A and the line width of the second electroconductive patterns 36B. However, the line width of the first electroconductive patterns 36A, the line width of the second electroconductive patterns 36B, and the line width of the first auxiliary patterns 38A and the second auxiliary patterns 38B should preferably be the same as each other.

Specifically, the line width of the thin metal lines that make up the transparent electroconductive layers should preferably have a lower limit of 1 µm or greater, or 3 µm or greater, or 4 µm or greater, or 5 µm or greater, and an upper limit of 9 µm or smaller or 8 µm or smaller. On the condition the line width is smaller than the above lower limit value, then since the electroconductivity of the transparent electroconductive layers becomes insufficient, they have insufficient detection sensitivity in a case where used on touch panels. On the condition the line width exceeds the upper limit value, then moire becomes distinctive, and visibility becomes poor in a case where used on touch panels. The line width in the above range is effective to improve moire in the first sensor area 26A and the second sensor area 26B, making visibility better in particular. The line interval (the distance between adjacent thin metal lines) should preferably be in the range from 30 µm to 500 µm, more preferably in the range from 50 µm to 400 µm, or most preferably in the range from 100 µm to 350 µm. The thin metal lines may include portions where the line width is greater than 200 µm for the purpose of making ground connections.

In terms of visible light transmittance, the aperture ratio of the first electroconductive film 16A and the second electroconductive film 16B according to the present embodiment should preferably be 85% or greater, more preferably 90% or greater, or most preferably 95% or greater. The aperture ratio refers to the ratio of the light-permeable areas, except the metal thin lines, to the overall film. For example, the aperture ratio of a square grid of metal thin lines having a line width of 6 µm and a thin line pitch of 240 µm is 95%.

Figure 4:
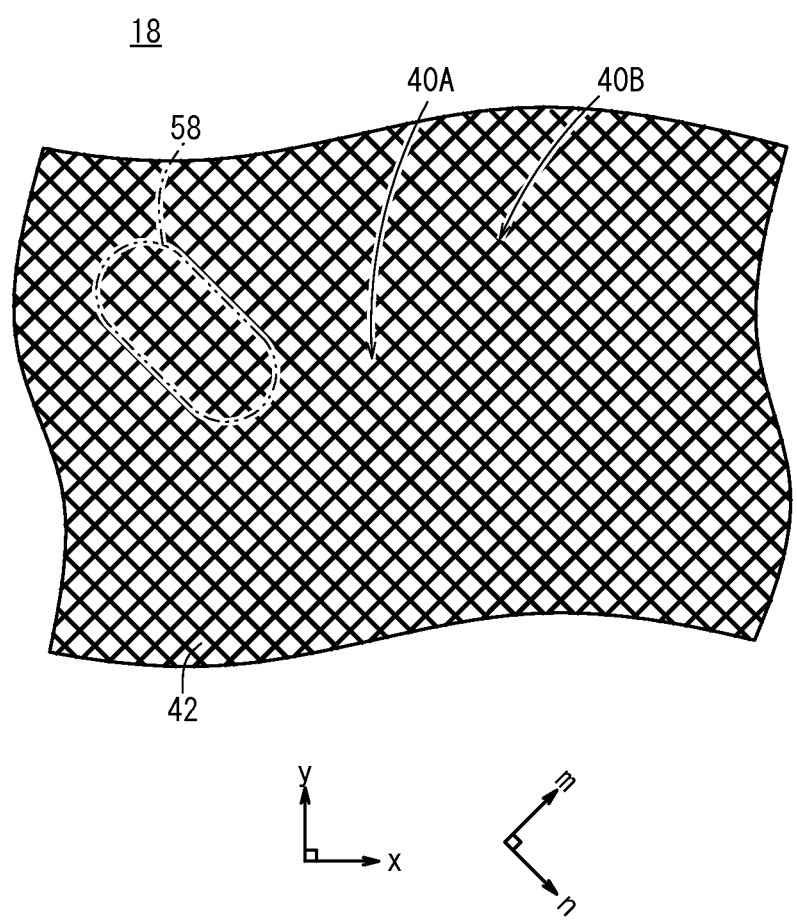
FIG. 4 is a plan view, partly omitted from illustration, showing an example in which a first electroconductive film (circuit board) and a second electroconductive film (circuit board) are combined into a laminated electroconductive film.

In a case where the first electroconductive film 16A is stacked on the second electroconductive film 16B, making up the laminated electroconductive film assembly 18, as shown in FIG. 4, the first electroconductive patterns 36A and the second electroconductive patterns 36B are disposed in crossing relation to each other. Specifically, the first connectors 44A of the first electroconductive patterns 36A and the second connectors 44B of the second electroconductive patterns 36B face each other with the first transparent base 32A (see FIG. 3) interposed therebetween.

Figure 5:
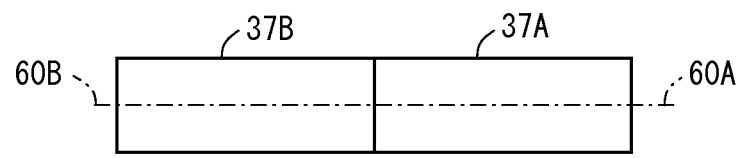
FIG. 5 is a view showing a state in which one line is formed of a first auxiliary line and a second auxiliary line.

In a case where the laminated electroconductive film assembly 18 is viewed from above, as shown in FIG. 4, the second large grids 40B of the second electroconductive film 16B are arrayed to fill up the gaps between the first large grids 40A of the first electroconductive film 16A. At this time, combined patterns 58 made of the first auxiliary patterns 38A and the second auxiliary patterns 38B that face each other are formed between the first large grid 40A and the second large grid 40B. As shown in FIG. 5, in each of the combined patterns 58, a first axial line 60A of the first auxiliary line 37A and a second axial line 60B of the second auxiliary line 37B are aligned with each other, but do not overlap each other. One end of the first auxiliary line 37A and one end of the second auxiliary line 37B are aligned witch other, making up one side of a small grid 42. In other words, the combined pattern 58 is in the form of a combination of two or more small grids 42. As a result, in a case where the laminated electroconductive film assembly 18 is viewed from above, it is in the form of a number of small grids 42 closely packed together, as shown in FIG. 4.

On the condition the laminated electroconductive film assembly 18 is to be used as the touch panel 10, then the protective layer 20 is provided on the first electroconductive film 16A. The first terminal interconnect patterns 50a extending from the first electroconductive patterns 36A of the first electroconductive film 16A is connected to the control circuit 14 (see FIG. 3) that controls a scanning process, for example. Likewise, the second terminal interconnect patterns 50b extending from the second electroconductive patterns 36B of the second electroconductive film 16B is connected to the control circuit 14.

A touched position may preferably be detected by a self capacitance process or a mutual capacitance process. Specifically, according to the self capacitance process, voltage signals for detecting a touched position are successively supplied to the first electroconductive patterns 36A, and voltage signals for detecting a touched position are successively supplied to the second electroconductive patterns 36B. In a case where a fingertip is brought into contact with or into the vicinity with the upper surface of the protective layer 20, the capacitance between the first electroconductive pattern 36A and the second electroconductive pattern 36B which face the touched position and GND (ground) increases. The waveforms of signals transmitted from the first electroconductive pattern 36A and the second electroconductive pattern 36B now become different from the waveforms of signals transmitted from the other electroconductive patterns. Therefore, the control circuit 14 calculates the touched position on the basis of the signals transmitted from the first electroconductive pattern 36A and the second electroconductive pattern 36B.

According to the mutual capacitance process, voltage signals for detecting a touched position are successively supplied to the first electroconductive patterns 36A, for example, and a sensing process (for detecting a transmitted signal) is performed successively on the second electroconductive patterns 36B. In a case where a fingertip is brought into contact with or into the vicinity with the upper surface of the protective layer 20, a stray capacitance of the finger is added parallel to the parasitic capacitance between the first electroconductive pattern 36A and the second electroconductive pattern 36B which face the touched position. The waveform of a signal transmitted from the second electroconductive pattern 36B now becomes different from the waveforms of signals transmitted from the other second electroconductive patterns 36B. The control circuit 14 calculates the touched position on the basis of the sequence of the first electroconductive patterns 36A to which the voltage signals are supplied and the supplied signal transmitted from the second electroconductive pattern 36B. The self capacitance process or the mutual capacitance process thus employed as a process of detecting a touched position is able to detect touched positions in a case where two fingertips are simultaneously brought into contact with or into the vicinity with the upper surface of the protective layer 20.

Background art documents about detection circuits of the projection-type electrostatic capacitance type include U.S. Pat. Nos. 4,582,955, 4,686,332, 4,733,222, 5,374,787, 5,543,588, 7,030,860, and U.S. Patent Application Publication No. 2004/0155871.

Two control systems for the touch panel 10 according to the present embodiment will be described below with reference to FIGS. 3, 6A, 6B, and 7.

The first control system is compatible with the self capacitance process. According to the first control system, as shown in FIG. 3, the control circuit 14 supplies a first pulse signal P1 for detecting a touched position to the first terminal interconnect patterns 50a (first metal interconnects), and supplies a second pulse signal P2 for detecting a touched position to the second terminal interconnect patterns 50b (first metal interconnects). The ground potential is applied to the first ground line 54a and the second ground line 54b.

Figure 6A:
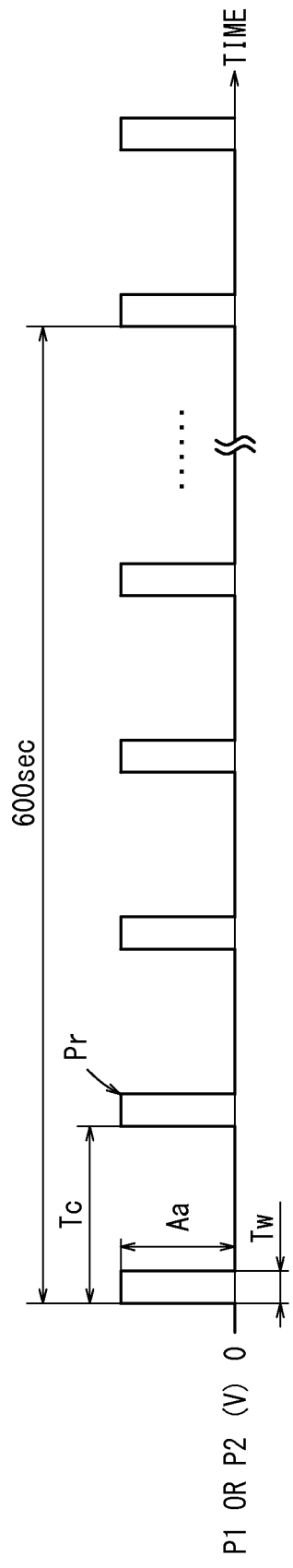
FIG. 6A is a waveform diagram showing a first signal format of a first pulse signal and a second pulse signal.
Figure 6B:
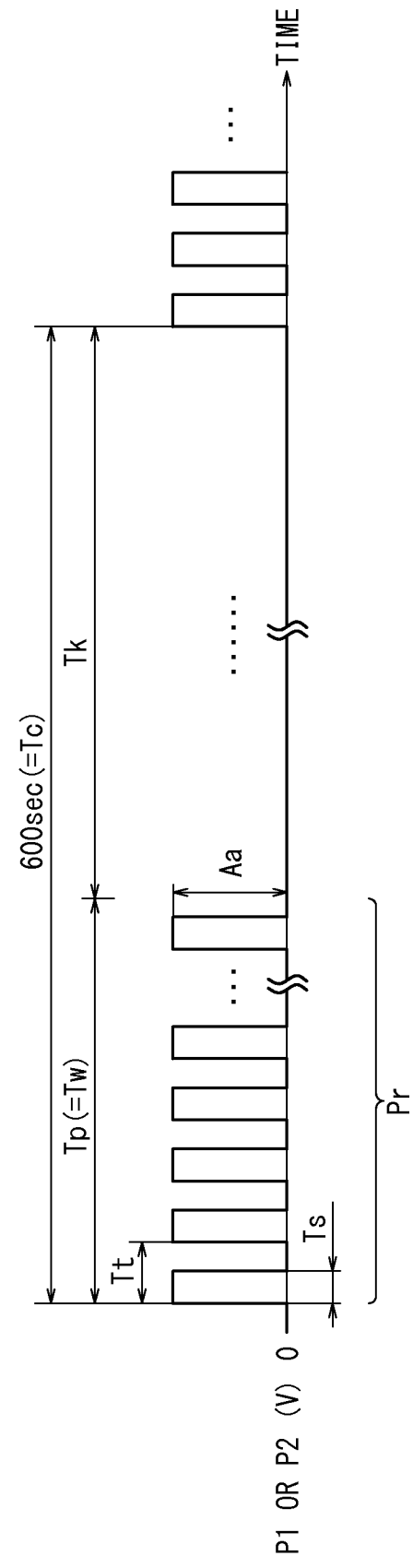
FIG. 6B is a waveform diagram showing a second signal format of a first pulse signal and a second pulse signal.

As shown in FIGS. 6A and 6B, the first pulse signal P1 and the second pulse signal P2 have a pulse train Pr of a plurality of pulses whose reference level is the same as a fixed potential and which have a pulse duration of 3 msec. or shorter. The integrated time of pulses during 600 seconds is less than 60 seconds.

The potential difference between the first terminal interconnect patterns 50a and the first ground line 54a and the potential difference between the second terminal interconnect patterns 50b and the second ground line 54b are thus reduced for an advantage in suppressing migration between the interconnects. This leads to controlling the mobility and displacement of metal ions in the first metal interconnects (the first terminal interconnect patterns 50a and the second terminal interconnect patterns 50b). Specifically, the displacement of metal ions toward the ground potential due to the application of pulses and the displacement of metal ions to the first metal interconnects during the periods of the reference level are controlled for thereby controlling oxidation/reduction of the metal ions, with the result that the development of ion migration is assumed to be suppressed. The amplitudes of the signals transmitted from the first terminal interconnect patterns 50a and the second terminal interconnect patterns 50b to the control circuit 14 are so minute compared with the amplitudes of the first pulse signal P1 and the second pulse signal P2 that ion migration does not take place between the interconnects.

The first pulse signal P1 and the second pulse signal P2 have two signal formats (first signal format and second signal format).

As shown in FIG. 6A, the first signal format is a format wherein the pulse train Pr is output in constant pulse periods Tc repeated during 600 seconds. In this case, the duty ratio (pulse duration Tw/pulse period Tc) should preferably be less than 10%.

The second signal format is a format having, during 600 seconds, a pulse train output period Tp in which the pulse train Pr is output and an idle period Tk in which the fixed potential is continuously output. On the condition it is assumed that 600 seconds represent a pulse period Tc and the pulse train output period Tp represents a pulse duration Tw, then the duty ratio (pulse duration Tw/pulse period Tc) should preferably be less than 10%.

In the touch panel 10 according to the present embodiment, the potential difference between the first terminal interconnect patterns 50a and the first ground line 54a and the potential difference between the second terminal interconnect patterns 50b and the second ground line 54b can be reduced. As a result, even though the first terminal interconnect patterns 50a, the first ground line 54a, the second terminal interconnect patterns 50b, and the second ground line 54b are made of silver, copper, or the like, ion migration is prevented from being developed between the interconnects, preventing the detection accuracy from being lowered.

The second control system is compatible with the mutual capacitance process. As shown in FIG. 7, the second control system is of essentially the same arrangement as the first control system, but is different therefrom in that a pulse signal (the first pulse signal P1) is applied only to the first terminal interconnect patterns 508.

With the second control system, the potential difference between the first terminal interconnect patterns 50a and the first ground line 54a can also be reduced, so that ion migration is prevented from being developed between the interconnects, preventing the detection accuracy from being lowered. The amplitude of the signal transmitted from the second terminal interconnect patterns 50b is so minute compared with the amplitude of the first pulse signal P1 that ion migration does not take place between the interconnects.

Figure 8:
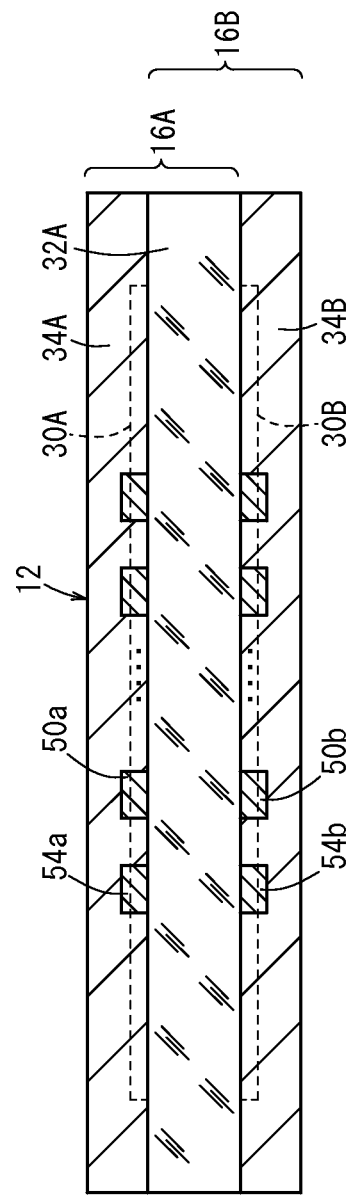
FIG. 8 is a view showing another example of cross-sectional structure of the laminated electroconductive film.

In the laminated electroconductive film assembly 18, as shown in FIG. 3, the first electroconductive section 30A is disposed on the surface of the first transparent base 32A, and the second electroconductive section 30B is disposed on the surface of the second transparent base 32B. According to another example, as shown in FIG. 8, the first electroconductive section 30A may be disposed on the surface of the first transparent base 32A, and the second electroconductive section 30B may be disposed on the reverse side of the first transparent base 32A. In this case, the second transparent base 32B is dispensed with, and the first transparent base 32A is stacked on the second electroconductive section 30B whereas the first electroconductive section 30A is stacked on the first transparent base 32A. The first transparent adhesive layer 34A is disposed in covering relation to the first electroconductive section 30A, and the second transparent adhesive layer 34B is disposed in covering relation to the second electroconductive section 30B. Another layer may be interposed between the first electroconductive film 16A and the second electroconductive film 16B, and the first electroconductive patterns 36A and the second electroconductive patterns 36B may be disposed in facing relation to each other provided they are insulated from each other.

As shown in FIG. 1, first alignment marks 66a and second alignment marks 66b for positioning the first electroconductive film 16A and the second electroconductive film 16B at the time they are to be bonded to each other should preferably be disposed on respective corners, for example, of the first electroconductive film 16A and the second electroconductive film 16B. The first alignment marks 66a and the second alignment marks 66b serve as new composite alignment marks after the first electroconductive film 16A and the second electroconductive film 16B are bonded into the laminated electroconductive film assembly 18. The composite alignment marks also function as alignment marks for positioning the laminated electroconductive film assembly 18 in a case where it is to be placed on the display panel 24.

In the above example, the first electroconductive film 16A and the second electroconductive film 16B are applied to the touch panel 10 of the projection-type electrostatic capacitance type. However, the first electroconductive film 16A and the second electroconductive film 16B may be applied to a touch panel of the surface-type electrostatic capacitance type and a touch panel of the resistance film type.

The electroconductive patterns on the first electroconductive film 16A and the second electroconductive film 16B may comprise electroconductive patterns wherein there are a plurality of parallel strips of mesh patterns divided by insulating areas, other than those described above.

Specifically, patterns according to a first modification may have two or more strip-like first electroconductive patterns extending from respective terminals in the first direction (x direction) and arrayed in the second direction (y direction) perpendicular to the first direction. Patterns according to a second modification may have, unlike the first modification, two or more strip-like second electroconductive patterns extending from respective terminals in the second direction (y direction) and arrayed in the first direction (x direction).

Each of the electroconductive patterns may have one opening surrounded by thin metal lines, thereby providing a pattern wherein a plurality of closed mesh shapes are arrayed. The mesh shapes may be a square shape, a rectangular shape, a regular hexagonal shape, or the like.

The patterns according to the first embodiment and the patterns according to the second modification are superposed one on the other with a transparent base, for example, interposed therebetween, so that the strip-like first electroconductive patterns and the strip-like second electroconductive patterns cross each other. These first and second electroconductive patterns are suitable for use as electroconductive patterns on a touch panel of the projection-type electrostatic capacitance type, for example.

The first electroconductive film 16A and the second electroconductive film 16B according to the present embodiment may be used as an electroconductive film for the touch panel of the display device 22, an electromagnetic wave shield film of the display device 22, or an optical film on the display panel 24 of the display device 22. The display device 22 may be a liquid crystal display, a plasma display, an organic EL display, an inorganic EL display, or the like.

Methods of manufacturing the first electroconductive film 16A as a representative example will be described below. According to a first method for manufacturing the first electroconductive film 16A, a photosensitive material having an emulsion layer containing a photosensitive silver halide as the first transparent base 32A, for example, is exposed to light and developed. Exposed areas and unexposed areas are made into metal silver areas and light-permeable areas, thereby producing the first electroconductive section 30A. Furthermore, the metal silver areas may additionally be processed by at least one of physical development and plating, so that an electroconductive metal may be carried in the metal silver areas. An overall layer wherein the electroconductive metal is carried in the metal silver areas will be referred to as an electroconductive metal area.

According to a second method, a photosensitive plated layer is formed on the first transparent base 32A using a plating pretreatment material, after which it is exposed to light, developed, and then plated. Exposed areas and unexposed areas are made into metal areas and light-permeable areas, thereby producing a first electroconductive section 30A. Furthermore, the metal areas may additionally be processed by at least one of physical development and plating, so that an electroconductive metal may be carried in the metal areas.

Preferred forms of the method using the plating pretreatment material (second method) should preferably include the following two forms: Specific details of the forms described below are disclosed in Japanese Laid-Open Patent Publication No. 2003-213437, Japanese Laid-Open Patent Publication No. 2006-064923, Japanese Laid-Open Patent Publication No. 2006-058797, and Japanese Laid-Open Patent Publication No. 2006-135271, etc.

(a) A first transparent base 32A is coated with a plated layer containing a functional group that will interact with a plating catalyst or a precursor thereof. Thereafter, the plated layer is exposed to light, developed, and then plated to form a metal portion on the plated material.

(b) A foundation layer containing a polymer and a metal oxide and a plated layer containing a functional group that will interact with a plating catalyst or a precursor thereof are deposited in the order described on a first transparent base 32A. Thereafter, the plated layer is exposed to light, developed, and then plated to form a metal portion on the plated material.

According to a third method, a photoresist film on a copper foil on a first transparent base 32A is exposed to light and developed into a resist pattern. A copper foil unmasked in the resist pattern is etched into a first electroconductive section 30A.

According to a fourth method, a paste containing fine metal particles is printed on a first transparent base 32A. Then, the paste is plated with a metal, forming a first electroconductive section 30A.

According to a fifth method, a first electroconductive section 30A is printed on a first transparent base 32A with a screen printing plate or a gravure printing plate.

According to a sixth method, a first electroconductive section 30A is formed on a first transparent base 32A by an ink jet.

The makeup of each of the layers of the first electroconductive film 16A and the second electroconductive film 16B will be described in detail below.

[Transparent Base]

The first transparent base 32A and the second transparent base 32B may comprise a plastic film, a plastic plate, a glass plate, or the like. The plastic film and the plastic plate may be made of a polyester such as polyethylene terephthalate (PET), polyethylene naphthalate (PEN), or the like, or triacetyl cellulose (TAC) or the like. A plastic film or a plastic plate whose melting point is equal to or lower than approximately 290° C. is preferable for use as the first transparent base 32A and the second transparent base 32B. Particularly, PET is preferable from the standpoint of light permeability, processability, etc.

[Silver Salt Emulsion Layer]

The silver salt emulsion layer to be made into the thin metal lines of the transparent electroconductive layer contains additives such as a solvent, a dye. etc. other than a silver salt and a binder.

The silver salt used according to the present embodiment includes an inorganic silver salt such as a silver halide or the like and an organic silver salt such as silver acetate or the like. According to the present embodiment, it is preferable to use a silver halide having excellent properties for use as an optical sensor.

The amount of coated silver (the amount of coated silver salt) of the silver salt emulsion layer should preferably be in the range from 1 to 30 g/m$^2$ in terms of silver, more preferably be in the range from 1 to 25 g/m$^2$, and much more preferably be in the range from 5 to 20 g/m$^2$. The amount of coated silver in the above range allows the electroconductive film to achieve a desired surface resistance.

The binder used according to the present embodiment includes, for example, gelatin, polyvinyl alcohol (PVA), polyvinylpyrrolidone (PVP), polysaccharide such as starch or the like, cellulose or its derivative, polyethylene oxide, polyvinyl amine, chitosan, polylysine, polyacrylic acid, polyalginic acid, polyhyaluronic acid, carboxycellulose, or the like. These materials have neutral, anionic, and cationic properties due to the ionicity of the functional group.

The amount of the binder contained in the silver salt emulsion layer according to the present embodiment is not limited to any particular value, but may be appropriately determined within a range capable of exhibiting diffusing and adhering capabilities. The amount of the binder contained in the silver salt emulsion layer should preferably be equal to or larger than 1/4 in terms of a silver/binder volume ratio, and more preferably be equal to or more than 1/2. The silver/binder volume ratio should preferably be equal to or less than 100/1, and more preferably be equal to or less than 50/1. The silver/binder volume ratio should further preferably be in the range of 1/1 to 4/1, and most preferably be in the range of 1/1 to 3/1. The silver/binder volume ratio in the silver salt emulsion layer in the above ranges can suppress variations in the resistance value even on the condition the amount of coated silver is adjusted. As a result, it is possible to obtain an electroconductive film having a uniform surface resistance. The silver/binder volume ratio can be determined by converting the amount of silver halide/the amount of binder (weight ratio) of the raw material into the amount of silver/the amount of binder (weight ratio), and converting the amount of silver/the amount of binder (weight ratio) into the amount of silver/the amount of binder (volume ratio).

<Solvent>

The solvent used to form the silver salt emulsion layer is not limited to any particular material, but may be water, an organic solvent (e.g., an alcohol such as methanol or the like, a ketone such as acetone or the like, an amide such as formamide or the like, a sulfoxide such as dimethyl sulfoxide or the like, an ester such as ethyl acetate or the like, or an ether), an ionic liquid, or a solvent as a mixture of these materials.

<Other Additives>

Various additives used according to the present embodiment are not limited to any particular materials. Known additives may preferably be used.

[Transparent Adhesive Layer]

The first transparent adhesive layer 34A and the second transparent adhesive layer 34B have a transparent adhesive made of at least one selected from a group consisting of a component A, a component B, and a component C, described below, which are optically transparent.

On the condition the transparent adhesive is 100 parts, then it contains 45 to 95 parts of the component A, 20 to 50 parts of the component B, and 1 to 40 parts of the component C.

Component A: An alkyl (meth)acrylate monomer whose glass transition temperature $T_g$ is 25° C. or lower (the alkyl group has 4 through 18 carbon atoms);

Component B: An ester of (meth)acrylate monomer whose glass transition temperature $T_g$ is 25° C. or higher; and Component C: A monomer selected from a group of hydroxyalkyl (meth)acrylate, unsubstituted (meth)acrylamide, N-alkyl-substituted (meth)acrylamide, N,N-dialkyl-substituted (meth)acrylamide, a monomer having a urea functional group, and a monomer having a lactam functional group, a tertiary amine, an alicyclic amine, an aromatic amine, or a combination of these materials.

The component A comprises at least one selected from a group consisting of n-butyl acrylate, 2-ethyl-hexyl (meth)acrylate, isooctyl acrylate, 2-methylhexyl acrylate, and a combination thereof.

The component B comprises at least one selected from a group consisting of methyl (meth)acrylate, ethyl (meth)acrylate, isobornyl (meth)acrylate, and a combination thereof.

The component C comprises at least one selected from a group consisting of 2-hydroxyethyl (meth)acrylate, 3-hydroxypropyl (meth)acrylate, N-octylacrylamide, N,N-dimethylacrylamide, N. N-diethylacrylamide, vinylpyridine, vinylimidazole, N,N-dialkylaminoalkyl (meth)acrylate (the alkyl group has 1 through 4 carbon atoms), and a combination thereof.

The components A, B, C described above may be weighed and mixed into an optically transparent adhesive. These components may be cross-linked alone or may be cross-linked by a common cross-linking agent. The cross-linking agent may be a thermal cross-linking agent that is activated during a drying process for manufacturing a solvent coating adhesive. Such thermal cross-linking agents include polyfunctional isocyanate, aziridine, and an epoxy compound. In addition, a transparent adhesive may be cross-linked using an optical reaction initiator. Preferable optical reaction initiators include benzophenone and 4-acryloxy benzophenone.

The above transparent adhesive may be prepared by solvent-system solution polymerization or bulk polymerization.

According to the solvent-system solution polymerization, a solvent-system transparent adhesive, components, and additives are mixed in an organic solvent, and the solution is coated and then dried. The solvent-system transparent adhesive may be cross-linked during a drying process or may be cross-linked after a drying process in some instances.

According to the bulk polymerization, a monomer premix containing the component A and at least one of the components B, C is mixed with a reaction initiator (either an optical reaction initiator or a thermal reaction initiator). Then, the mixture is partly polymerized using a radiator such as ultraviolet rays or the like, forming a syrup that can be coated. In case desired, a cross-linking agent is added to the syrup before the syrup is applied to a flexible base.

According to another process, the components (the components A, B, C) of the transparent adhesive are mixed with additives (an optical or thermal reaction initiator and, in case desired, a cross-linking agent). The monomer or monomer mixture can be used, e.g., in gap filling applications to fill gaps between two bases such as two glass bases or the like.

Preferable examples of the components A, B, C are as follows: The component A comprises 2-ethyl-hexyl (meth)acrylate, the component B comprises isobornyl (meth)acrylate, and the component C comprises 2-hydroxyethyl (meth)acrylate. More specifically, a preferable transparent adhesive contains 50 to 65 parts of 2-ethyl-hexyl (meth)acrylate as the component A, 15 to 30 parts of isobornyl (meth)acrylate as the component B, and 20 to 30 parts of 2-hydroxyethyl (meth)acrylate as the component C.

The transparent adhesive contains the components A, C (not the component B) where, preferably, the component A comprises n-butyl acrylate and the component C comprises 2-hydroxyethyl (meth)acrylate.

[Other Layer Structures]

A protective layer, not shown, may be provided on the silver salt emulsion layer, and an undercoat layer, for example, may be provided beneath the silver salt emulsion layer.

[Electroconductive Films]

The thickness of the first transparent base 32A of the first electroconductive film 16A and the second transparent base 32B of the second electroconductive film 16B should preferably be in the range from 5 to 350 µm and more preferably be in the range from 30 to 150 µm. The thickness in the range from 5 to 350 µm allows the electroconductive films to have a desired permeability to visible light and to be handled with ease.

The thickness of the metal silver areas on the first transparent base 32A and the second transparent base 32B can appropriately be determined depending on the coated thickness of a coating for the silver salt emulsion layers on the first transparent base 32A and the second transparent base 32B. Though a value in the range of 0.001 mm to 0.2 mm can be selected for the thickness of the metal silver areas, the thickness of the metal silver areas should preferably be equal to or less than 30 µm, more preferably be equal to or less than 20 µm, much more preferably be in the range of 0.01 to 9 µm, and most preferably be in the range of 0.05 to 5 µm. The metal silver areas should preferably be shaped in a pattern. The metal silver areas may be in one layer or may be of a multi-layered structure including two or more layers. On the condition the metal silver areas are shaped in a pattern and of a multi-layered structure including two or more layers, then different color sensitivities can be given to the metal silver areas for making them sensitive to different wavelengths. The different color sensitivities that are given to the metal silver areas make it possible to form different patterns in the respective layers in a case where the metal silver areas are exposed to different exposure wavelengths.

The thickness of the electroconductive metal areas for use in the touch panel 10 should preferably be thinner as it gives a wider angle of view to the display panel 24. The electroconductive metal areas are also required to be thinner for an increased visibility. From these points of view, the thickness of the layer of the electroconductive metal carried by the electroconductive metal areas should preferably be less than 9 µm, more preferably be in the range from 0.1 µm to less than 5 µm, and much more preferably be in the range from 0.1 µm to less than 3 µm.

According to the present embodiment, metal silver areas having a desired thickness can be formed by controlling the coated thickness of the silver salt emulsion layer referred to above, and the thickness of the layer made up of electroconductive metal particles can freely be controlled by at least one of the physical development process and the plating process. Therefore, an electroconductive film whose thickness is less than 5 µm or preferably less than 3 µm can easily be formed.

The method of manufacturing the first electroconductive film 16A and the second electroconductive film 16B may not necessarily include steps such as a plating step because the desired surface resistance can be obtained by adjusting the coated amount of silver in the silver salt emulsion layer and the silver/binder volume ratio. In case necessary, a calendering process, etc. may be carried out.

The present invention can appropriately be combined with the technologies disclosed in Japanese Laid-Open Patent Publications and WO pamphlets listed in Table 1 and Table 2 below, where the terms "Japanese Laid-Open Patent Publication No.", "Publication No.", and "Pamphlet No." are omitted.

TABLE 1

| | | | | |
|---|---|---|---|---|
| 2004-221564 | 2004-221565 | 2007-200922 | 2006-352073 | 2006-228469 |
| 2007-235115 | 2007-207987 | 2006-012935 | 2006-010795 | 2006-072171 |
| 2006-332459 | 2009-21153 | 2007-226215 | 2006-261315 | 2006-324203 |
| 2007-102200 | 2006-228473 | 2006-269795 | 2008-336090 | 2006-336099 |
| 2006-228478 | 2006-228836 | 2007-009326 | 2007-201378 | 2007-335729 |
| 2006-348351 | 2007-270321 | 2007-270322 | 2007-178915 | 2007-334325 |
| 2007-134439 | 2007-149760 | 2007-208133 | 2007-207883 | 2007-013130 |
| 2007-310091 | 2007-116137 | 2007-088219 | 2008-227351 | 2008-244067 |
| 2005-302508 | 2008-218784 | 2008-227350 | 2008-277676 | 2008-282840 |
| 2008-267814 | 2008-270405 | 2008-277675 | 2008-300720 | 2008-300721 |
| 2008-283029 | 2008-288305 | 2008-288419 | 2009-21334 | 2009-26933 |
| 2009-4213 | 2009-10001 | 2009-16526 | 2008-171568 | 2008-198388 |
| 2008-147507 | 2008-159770 | 2008-159771 | 2008-235224 | 2008-235467 |
| 2008-218096 | 2008-218264 | 2008-224916 | 2008-252046 | 2008-277428 |
| 2008-241987 | 2008-251274 | 2008-251275 | 2007-129205 | |

TABLE 2

| | | | | |
|---|---|---|---|---|
| 2006/001461 | 2006/088059 | 2006/098333 | 2006/098336 | 2006/098338 |
| 2006/098335 | 2006/098334 | 2007/001008 | | |

INVENTIVE EXAMPLES

The present invention will be described more specifically below with respect to Inventive Examples according to the present invention. The materials, their amounts used, their ratios, the processing details, and the processing sequences described in the inventive examples can be changed without departing from the gist of the present invention. Therefore, the scope of the present invention shall not be interpreted as being restricted by the specific example to be described below.

First Exemplary Embodiment

According to the first exemplary embodiment, the whitening resistance capability of a transparent adhesive layer used was assessed.

Transparent Double-Sided Adhesive Sheet

Synthesis Example 1

Fabrication of Transparent Double-Sided Adhesive Sheet S-1

A reaction container having a stirrer for preparing an acrylic copolymer, a recirculating freezer, a thermometer, a dropping funnel, and a nitrogen gas inlet port was used. In the reaction container, 50 parts by weight of 2-ethyl-hexyl acrylate, 25 parts by weight of isobornyl acrylate, and 25 parts by weight of 2-hydroxyethyl acrylate were dissolved in 100 parts by weight of ethyl acetate. After nitrogen substitution, the solution was heated to an inner temperature of 70° C.

To this reaction liquid dropped a solution wherein 0.1 part of 2,2'-azobis(2,4-dimethylvaleronitrile) and 10 parts of ethyl acetate had been dissolved in advance, while at the same time the reaction liquid was stirred for 3 hours, obtaining an acrylic copolymer (P-1) having a weight-average molecular weight of 400,000.

Then, the above acrylic copolymer (P-1) and 0.7 parts by weight of an isocyanate cross-linking agent (CORONATE L-45, solid content: 45%, manufactured by Nippon Polyurethane Industry Co., Ltd.) were added together and stirred for 5 minutes. To the mixture was added a solution wherein DL-α-tocopherol was dissolved in a solvent of ethyl acetate and toluene mixed together (ethyl acetate/toluene=1/1). The solution was stirred for 5 minutes, obtaining an adhesive composition composed of 100 parts by weight of solid acrylic copolymer and 0.5 parts by weight of DL-α-tocopherol.

A PET film having a thickness of 50 μm, one surface of which had been peeled off by a silicone compound, was coated with the above adhesive composition to a dried thickness of 50 μm. Thereafter, the coated PET film was dried at 75° C. for 5 minutes. The obtained adhesive sheet and a PET film having a thickness of 38 μm, one surface of which had been peeled off by a silicone compound, were bonded to each other. Thereafter, the assembly was aged at 23° C. for 5 days, obtaining a transparent double-sided adhesive sheet (base-less adhesive sheet) S-1 having a thickness of 50 μm.

Synthesis Example 2

Production of Transparent Double-Sided Adhesive Sheet S-2

75 parts by weight of butyl acrylate and 25 parts by weight of 2-hydroxyethyl acrylate were used, instead of 50 parts by weight of 2-ethyl-hexyl acrylate, 25 parts by weight of isobornyl acrylate, and 25 parts by weight of 2-hydroxyethyl acrylate. Using these materials, an acrylic copolymer was polymerized, producing a transparent double-sided adhesive sheet S-2 according to the same procedure as with Synthesis Example 1 except that DL-α-tocopherol was not used.

Synthesis Example 3

Production of Transparent Double-Sided Adhesive Sheet S-3

60 parts by weight of butyl acrylate, 25 parts by weight of 2-ethyl-hexyl acrylate, and 15 parts by weight of methyl methacrylate were used, instead of 50 parts by weight of 2-ethyl-hexyl acrylate, 25 parts by weight of isobornyl acrylate, and 25 parts by weight of 2-hydroxyethyl acrylate. Using these materials, an acrylic copolymer was polymerized, producing a transparent double-sided adhesive sheet S-3 according to the same procedure as with Synthesis Example 1 except that DL-α-tocopherol was not used.

Synthesis Example 4

Production of Transparent Double-Sided Adhesive Sheet S-4

A transparent double-sided adhesive sheet S-4 was produced according to the same procedure as with Synthesis Example 1 except that 25 parts by weight of 2-hydroxyethyl acrylate were replaced with 20 parts by weight of 2-hydroxyethyl acrylate and that 25 parts by weight of isobornyl acrylate were replaced with 30 parts by weight of isobornyl acrylate.

Synthesis Example 5

Production of Transparent Double-Sided Adhesive Sheet S-5

A transparent double-sided adhesive sheet S-5 was produced according to the same procedure as with Synthesis Example 1, except that 25 parts by weight of 2-hydroxyethyl acrylate were replaced with 30 parts by weight of 2-hydroxyethyl acrylate and that 25 parts by weight of isobornyl acrylate were replaced with 20 parts by weight of isobornyl acrylate.

Synthesis Example 6

Production of Transparent Double-Sided Adhesive Sheet S-6

A transparent double-sided adhesive sheet S-6 was produced according to the same procedure as with Synthesis Example 1 except that 50 parts by weight of 2-ethyl-hexyl acrylate were replaced with 65 parts by weight of 2-ethylhexyl acrylate and that 25 parts by weight of isobornyl acrylate were replaced with 15 parts by weight of isobornyl acrylate.

[Environmental Test (Assessment of a Whitening Resistance Capability)]

Each of the transparent double-sided adhesive sheets S-1, S-2, S-3, S-4, S-5, and S-6 was cut to a prescribed size (length of 5 cm×width of 4 cm). The peel-off sheet on one surface of the transparent double-sided adhesive sheet was peeled off, and the transparent double-sided adhesive sheet was applied to a glass base with the adhesive surface thereof being applied as a stacked surface to the glass base. The peel-off film on the other surface of the transparent double-sided adhesive sheet was peeled off, and the transparent double-sided adhesive sheet was applied to a PET base (having a thickness of 50 μm), thus fabricating a sample for assessment.

The sample of assessment was left to stand for 120 hours under the conditions of 85° C. and 85% RH. Thereafter, in a case where the sample for assessment was left to stand at 23° C. and 50% RH, a time was measured until the sample for assessment (transparent adhesive layer) reached a haze of 3% or lower. The samples were assessed according to the standards given below. Practically, assessment A represents an excellent whitening resistance capability.

A: less than 6 hours
B: 6 hours or longer and less than 12 hours
C: 12 hours or longer The haze was measured using HR-100 manufactured by Murakami Color Research Laboratory.

[Results of Assessment]

The results of assessment of the excellent whitening resistance capabilities of the transparent double-sided adhesive sheets S-1, S-2, S-3, S-4, S-5, and S-6 are shown in Table 3:

TABLE 3

| Types of transparent adhesive sheets | Monomer components (parts) of acrylic copolymer | | | | | Whitening resistance test |
|---|---|---|---|---|---|---|
| | 2-ethyl-hexyl acrylate | isobornyl acrylate | 2-hydroxyethyl acrylate | butyl acrylate | methyl methacrylate | |
| S-1 | 50 | 25 | 25 | — | — | A |
| S-2 | — | — | 25 | 75 | — | A |
| S-3 | 25 | — | — | 60 | 15 | C |
| S-4 | 50 | 30 | 20 | — | — | B |
| S-5 | 50 | 20 | 30 | — | — | B |
| S-6 | 65 | 15 | 25 | — | — | B |

As can be seen from Table 3, the transparent double-sided adhesive sheet S-3 had assessment "C", whereas the other transparent double-sided adhesive sheets S-1, S-2, S-4, S-5, and S-6 had good assessment "B" or higher. In particular, the transparent double-sided adhesive sheets S-1, S-2 had best assessment "A".

Consequently, it is preferable to use 2-ethyl-hexyl (meth) acrylate, isobornyl (meth)acrylate, and 2-hydroxyethyl (meth)acrylate as the components of the transparent adhesive layer. It is more preferable for the transparent adhesive layer to contain 50 to 65 parts of 2-ethyl-hexyl (meth) acrylate, 15 to 30 parts of isobornyl (meth)acrylate, and 20 to 30 parts of 2-hydroxyethyl (meth)acrylate. It is also preferable to use n-butyl acrylate and 2-hydroxyethyl (meth) acrylate as other components of the transparent adhesive layer.

Second Exemplary Embodiment

According to the second exemplary embodiment, Inventive Examples 1 through 8 and Comparative Examples 1 through 10 were assessed for periods of time during which the insulation resistance between interconnects (insulation resistance life) was maintained in different patterns of applied pulse signals. The transparent double-sided adhesive layer S-1 whose whitening resistance capability had assessment "A" in the first exemplary embodiment was used as the transparent double-sided adhesive layers according to the first exemplary embodiment.

Inventive Example 1

Figure 9:
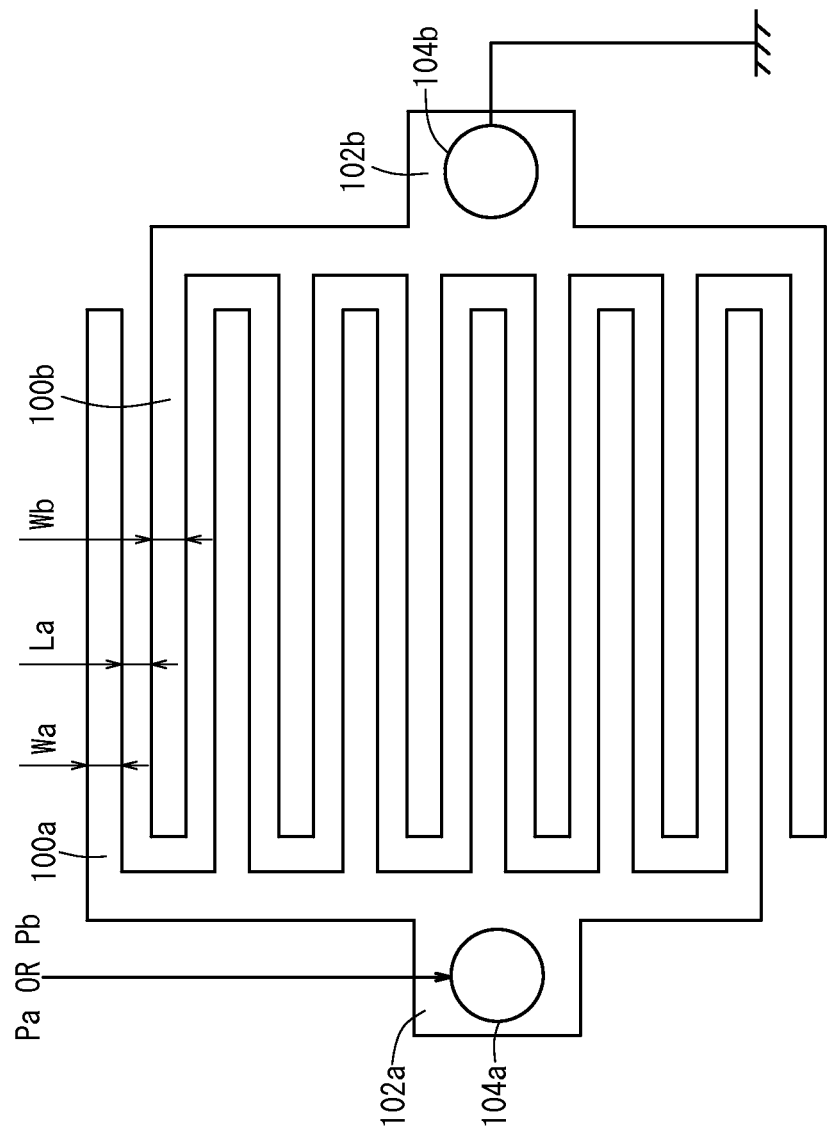
FIG. 9 is a view showing an example of pattern of a first metal interconnect and a second metal interconnect used in the embodiment.

Metal interconnects were formed on a PET base using of a silver paste (LS450-7HL manufactured by Asahi Chemical Research Laboratory) according to a screen printing process. Specifically, as shown in FIG. 9, a comb-toothed first metal interconnect 100a which is assumed to be a first terminal interconnect pattern 50a and a comb-toothed second metal interconnect 100b which is assumed to be a first ground line 54a were formed. In this instance, metal interconnects that are of a striped shape as a whole were formed such that the first metal interconnect 100a and the second metal interconnect 100b have respective comb teeth interdigitated at constant distances therebetween. The first metal interconnect 100a has a first pad 102a, whereas the second metal interconnect 100b has a second pad 102b.

Of the first metal interconnect 100a and the second metal interconnect 100b, the comb teeth had respective line widths Wa, Wb of 40 μm. The spatial distance La between adjacent comb teeth of the first metal interconnect 100a and the second metal interconnect 100b was 40 μm.

Thereafter, the assembly was heated at 130° C. for 30 minutes, hardening the silver interconnects to thereby fabricate a metal-interconnect-attached insulated board that was provided with the silver interconnects.

(Production of Circuit Board)

The peel-off sheet on one surface of the transparent double-sided adhesive sheet S-1 was peeled off, and the adhesive surface thereof was applied as a stacked surface to the obtained metal-interconnect-attached insulated board. The peel-off film on the other surface of the transparent double-sided adhesive sheet S-1 was peeled off, and a PET film (having a thickness of 50 μm) was applied to the other adhesive surface thereof, thus obtaining a circuit board.

Thereafter, the obtained circuit board was treated in an autoclave for 20 minutes under the conditions of 45° C. and 0.5 MPa, thereby obtaining a circuit board T-1. Windows were formed in respective portions of the transparent double-sided adhesive sheet which correspond to the first pad 102a and the second pad 102b. The windows were filled with corrosion-inhibiting metal layers (e.g., of Au (gold), providing a first terminal 104a and a second terminal 104b.

[Insulation Resistance Life Test (Migration Assessment)]

A life test described below was conducted on the obtained circuit board T-1. The circuit board T-1 was placed in an atmosphere at a temperature of 85° C. and a relative humidity of 90% Rh. An arbitrary waveform generating device generated a pulse signal Pa shown in FIG. 10A, and applied the pulse signal Pa from outside to the first terminal 104a. The pulse signal Pa is of a pulse waveform having a reference level of 0 V, an amplitude Aa of +10 V, a pulse duration Tw of 1 msec., and a pulse period To of 33.33 msec. In Inventive Example 1, a pulse waveform having a duty ratio (pulse duration Tw/pulse period To) of approximately 3% was repeatedly applied to the first terminal 104a. According to the manner in which the pulse signal Pa was applied, the integrated time during which the pulse waveform was applied per 600 seconds (hereinafter simply referred to as "integrated applied time") was 18 seconds. An overall assessment time (hereinafter simply referred to as "assessment time") consumed until the integrated applied time reached 50 hours was 1667 hours.

In every 24 hours, the application of the pulse signal Pa was stopped, the first terminal 104a and the second terminal 104b were disconnected from each other, and the insulation resistance value between these terminals (the first terminal 104a and the second terminal 104b) was measured. A time consumed until the resistance value between the terminals dropped below $1 \times 10^6$ ohms was measured, and assessed according to the standards given below. Because of the life test, the examples have better characteristics in the named order of "A", "B", "C", "D".

"A": the integrated time during which a voltage of 10 V was applied was 50 hours or longer;

"B": the integrated time during which a voltage of 10 V was applied was 30 hours or longer and shorter than 50 hours;

"C": the integrated time during which a voltage of 10 V was applied was 10 hours or longer and shorter than 30 hours; and "D": the integrated time during which a voltage of 10 V was applied was shorter than 10 hours.

Inventive Example 2

A circuit board having the same structure as the circuit board T-1 was used. An arbitrary waveform generating device generated a pulse signal Pb shown in FIG. 10B, and applied the pulse signal Pb from outside to the first terminal 104a. The measured time was assessed in the same manner as with Inventive Example 1.

The pulse signal Pb had a reference level of 0 V and was of a signal format having, during 600 seconds, a pulse train output period Tp during which a pulse train Pr is output and an idle period Tk during which a fixed potential is continuously output. According to Inventive Example 2, in particular, the pulse train output period Tp was 18 seconds and the idle period Tk was 582 seconds. Each pulse of the pulse train Pr had an amplitude Aa of +10 V, a pulse duration Ts of 1 msec., and a pulse period Tt of 2 msec. On the condition it is assumed that 600 seconds represent a pulse period Tc and the pulse train output period Tp represents a pulse duration Tw for the pulse signal Pb in its entirety, then the duty ratio (pulse duration Tw/pulse period To) was 3.0%. According to the manner in which the pulse signal Pb was applied, the integrated applied time was 18 seconds and the assessment time was 1667 hours.

Inventive Example 3

A circuit board having the same structure as the circuit board T-1 was used. A pulse signal similar to the pulse signal Pa (see FIG. 10A) was applied to the first terminal 104a. The measured time was assessed in the same manner as with Inventive Example 1.

The pulse signal used in Inventive Example 3 was different from the pulse signal used in Inventive Example 1 in that it was of a pulse waveform having a pulse period Tc of 20.0 msec. Specifically, according to Inventive Example 3, a pulse waveform having a duty ratio (pulse duration Tw/pulse period Tc) of 5.0% was repeatedly applied to the first terminal 104a. According to the manner in which the pulse signal was applied, the integrated applied time was 30 seconds and the assessment time was 1000 hours.

Inventive Example 4

A circuit board having the same structure as the circuit board T-1 was used. A pulse signal similar to the pulse signal Pb (see FIG. 10B) was applied to the first terminal 104a. The measured time was assessed in the same manner as with Inventive Example 1.

The pulse signal used in Inventive Example 4 was different from the pulse signal used in Inventive Example 2 in that the pulse train output period Tp was 30 seconds and the idle period Tk was 570 seconds. Specifically, according to Inventive Example 4, a pulse waveform having a duty ratio (pulse duration Tw(=pulse train output period Tp)/pulse period Tc(=600 seconds)) of 5.0% was repeatedly applied to the first terminal 104a. According to the manner in which the pulse signal was applied, the integrated applied time was 30 seconds and the assessment time was 1000 hours.

Inventive Example 5

A circuit board having the same structure as the circuit board T-1 was used. A pulse signal similar to the pulse signal Pa (see FIG. 10A) was applied to the first terminal 104a. The measured time was assessed in the same manner as with Inventive Example 1.

The pulse signal used in Inventive Example 5 was different from the pulse signal used in Inventive Example 1 in that it was of a pulse waveform having a pulse duration Tw of 3 msec. and a pulse period Tc of 100.0 msec. Specifically, according to Inventive Example 5, a pulse waveform having a duty ratio (pulse duration Tw/pulse period Tc) of 3.0% was repeatedly applied to the first terminal 104a. According to the manner in which the pulse signal was applied, the integrated applied time was 18 seconds and the assessment time was 1667 hours.

Inventive Example 6

A circuit board having the same structure as the circuit board T-1 was used. A pulse signal similar to the pulse signal Pb (see FIG. 10B) was applied to the first terminal 104a. The measured time was assessed in the same manner as with Inventive Example 1.

The pulse signal used in Inventive Example 6 was different from the pulse signal used in Inventive Example 2 in that each pulse of the pulse train Pr had a pulse duration Ts of 3 msec, and a pulse period Tt of 6 msec. According to Inventive Example 6, as with Inventive Example 2, a pulse waveform having a duty ratio of 3.0% was repeatedly applied to the first terminal 104a. The integrated applied time and the assessment time were also the same as those in Inventive Example 2.

Inventive Example 7

A circuit board having the same structure as the circuit board T-1 was used. A pulse signal similar to the pulse signal Pa (see FIG. 10A) was applied to the first terminal 104a. The measured time was assessed in the same manner as with Inventive Example 1.

The pulse signal used in Inventive Example 7 was different from the pulse signal used in Inventive Example 1 in that it was of a pulse waveform having a pulse duration Tw of 3 msec. and a pulse period Tc of 60 msec. Specifically, according to Inventive Example 7, a pulse waveform having a duty ratio of 5.0% was repeatedly applied to the first terminal 104a. According to the manner in which the pulse signal was applied, the integrated applied time was 30 seconds and the assessment time was 1000 hours.

Inventive Example 8

A circuit board having the same structure as the circuit board T-1 was used. A pulse signal similar to the pulse signal Pb (see FIG. 10B) was applied to the first terminal 104a. The measured time was assessed in the same manner as with Inventive Example 1.

The pulse signal used in Inventive Example 8 was different from the pulse signal used in Inventive Example 2 in that each pulse of the pulse train Pr had a pulse duration Ts of 3 msec. and a pulse period Tt of 6.0 msec., the pulse train output period Tp was 30 seconds, and the idle time Tk was 570 seconds. Specifically, according to Inventive Example 8, a pulse waveform having a duty ratio of 5.0% was repeatedly applied to the first terminal 104a. According to the manner in which the pulse signal was applied, the integrated applied time was 30 seconds and the assessment time was 1000 hours.

Inventive Example 9

A copper foil board comprising a copper foil of 18 μm bonded to a PET base having a thickness of 50 μm by an adhesive of 20 μm was used. An etching mask was formed on the copper foil board by a photoresist process, and the first metal interconnect 100a and the second metal interconnect 100b were formed by etching in the same manner as with Inventive Example 1. The photoresist process was performed by applying a negative photoresist manufactured by Fujifilm Corporation up to approximately 10 μm to the copper foil board. The copper foil board was exposed through a negative mask of interconnect patterns at 0.1 J/cm$^2$, and thereafter subjected to alkaline development and dried. Then, the copper foil was etched to the pattern shape with an aqueous solution of iron (III) chloride. The copper foil board was otherwise processed in the same manner as with Inventive Example 1, obtaining a circuit board T-2. A pulse signal similar to the pulse signal Pa (see FIG. 10A) used in Inventive Example 1 was applied to the first terminal 104a of the obtained circuit board T-2, and an insulation resistance life test (migration assessment) was conducted thereon in the same manner as with Inventive Example 1.

Inventive Example 10

A circuit board having the same structure as the circuit board T-2 was used. A pulse signal similar to the pulse signal Pa (see FIG. 10A) used in Inventive Example 5 was applied to the first terminal 104a. The measured time was assessed in the same manner as with Inventive Example 5.

Comparative Examples 1, 3, 5, 7, 9

In each of these comparative examples, a circuit board having the same structure as the circuit board T-1 was used. A pulse signal similar to the pulse signal Pa (see FIG. 10A) was applied to the first terminal 104a. The measured time was assessed in the same manner as with Inventive Example 1.

The pulse signals used in Comparative Examples 1, 3, 5, 7, and 9 were different from the pulse signal used in Inventive Example 1 as follows: In Comparative Example 1, a pulse signal having a pulse period Tc of 10 msec. was used. In Comparative Example 3, a pulse signal having a pulse duration Tw of 3 msec. and a pulse period Tc of 30.0 msec. was used. In Comparative Example 5, a pulse signal having a pulse duration Tw of 5 msec. and a pulse period Tc of 166.67 msec. was used. In Comparative Example 7, a pulse signal having a pulse duration Tw of 5 msec. and a pulse period Tc of 100.0 msec. was used. In Comparative Example 9, a pulse signal having a pulse duration Tw of 5 msec. and a pulse period Tc of 50.0 msec. was used.

Comparative Examples 2, 4, 6, 8, 10

In each of these comparative examples, a circuit board having the same structure as the circuit board T-1 was used. A pulse signal similar to the pulse signal Pb (see FIG. 10B) was applied to the first terminal 104a. The measured time was assessed in the same manner as with Inventive Example 1.

The pulse signals used in Comparative Examples 2, 4, 6, 8, and 10 were different from the pulse signal used in Inventive Example 2 as follows: In Comparative Example 2, a pulse signal having a pulse train output period Tp of 60 seconds and an idle period Tk of 540 seconds was used. In Comparative Example 4, a pulse signal wherein each pulse of the pulse train Pr had a pulse duration Ts of 3 msec. and a pulse period Tt of 6.0 msec. and which had a pulse train output period Tp of 60 seconds and an idle period Tk of 540 seconds was used. In Comparative Example 6, a pulse signal wherein each pulse of the pulse train Pr had a pulse duration Ts of 5 msec. and a pulse period Tt of 10.0 msec. was used. In Comparative Example 8, a pulse signal wherein each pulse of the pulse train Pr had a pulse duration Ts of 5 msec. and a pulse period Tt of 10.0 msec. and which had a pulse train output period Tp of 30 seconds and an idle period Tk of 570 seconds was used. In Comparative Example 10, a pulse signal wherein each pulse of the pulse train Pr had a pulse duration Ts of 5 msec. and a pulse period Tt of 10.0 msec. and which had a pulse train output period Tp of 60 seconds and an idle period Tk of 540 seconds was used.

Comparative Example 11

A circuit board having the same structure as the circuit board T-2 was used. A pulse signal similar to the pulse signal Pa (see FIG. 10A) used in Comparative Example 1 was applied to the first terminal 104a. The measured time was assessed in the same manner as with Comparative Example 1.

Comparative Example 12

A circuit board having the same structure as the circuit board T-2 was used. A pulse signal similar to the pulse signal Pb (see FIG. 10B) used in Comparative Example 2 was applied to the first terminal 104a. The measured time was assessed in the same manner as with Comparative Example 2.

[Results of Assessment]

Migration assessment results of Inventive Examples 1 through 10 and Comparative Examples 1 through 12 are shown in Table 4.

It can be seen from Table 4 that each of Inventive Examples 1 through 10 had assessment "A" and was very good.

Of Comparative Examples 1 through 12, Comparative Examples 1, 2, and 11 had assessment "B" as each pulse had a pulse duration of 1 msec., and each of Comparative Examples 3 through 10 had assessment "C" or lower. Comparative Example 12 had assessment "C" though each pulse had a pulse duration of 1 msec.

It can be seen from the foregoing that each pulse should preferably have a pulse duration (the pulse duration Tw in FIG. 10A and the pulse duration Ts in FIG. 10B) of 3 msec. or lower, and the integrated time of pulses (integrated applied time) during 600 seconds should preferably be less than 60 seconds.

Especially, it can be seen from the results of Inventive Examples 1, 3, 5, 7, and 9 that the pulse signal Pa shown in

TABLE 4

| | Each pulse | | Manner in | | Integrated applied | | | |
|---|---|---|---|---|---|---|---|---|
| | Pulse duration (msec) | Pulse period (msec) | which pulses are applied | Idle period (sec) | time per 600 sec (sec) | Evaluation time (hours) | Duty ratio (%) | Insulation resistance life test |
| Inventive Example 1 | 1 | 33.33 | Repeated | 0 | 18 | 1667 | Approx. 3 | A |
| Inventive Example 2 | 1 | 2.0 | With idling | 582 | 18 | 1667 | 3.0 | A |
| Inventive Example 3 | 1 | 20.0 | Repeated | 0 | 30 | 1000 | 5.0 | A |
| Inventive Example 4 | 1 | 2.0 | With idling | 570 | 30 | 1000 | 5.0 | A |
| Comparative Example 1 | 1 | 10.0 | Repeated | 0 | 60 | 500 | 10.0 | B |
| Comparative Example 2 | 1 | 2.0 | With idling | 540 | 60 | 500 | 10.0 | B |
| Inventive Example 5 | 3 | 100.0 | Repeated | 0 | 18 | 1667 | 3.0 | A |
| Inventive Example 6 | 3 | 6.0 | With idling | 582 | 18 | 1667 | 3.0 | A |
| Inventive Example 7 | 3 | 60.0 | Repeated | 0 | 30 | 1000 | 5.0 | A |
| Inventive Example 8 | 3 | 6.0 | With idling | 570 | 30 | 1000 | 5.0 | A |
| Inventive Example 9 | 1 | 33.33 | Repeated | 0 | 18 | 1667 | Approx. 3 | A |
| Inventive Example 10 | 3 | 100.0 | Repeated | 0 | 18 | 1667 | 3.0 | A |
| Comparative Example 3 | 3 | 30.0 | Repeated | 0 | 60 | 500 | 10.0 | C |
| Comparative Example 4 | 3 | 6.0 | With idling | 540 | 60 | 500 | 10.0 | C |
| Comparative Example 5 | 5 | 166.67 | Repeated | 0 | 18 | 1667 | Approx. 3 | C |
| Comparative Example 6 | 5 | 10.0 | With idling | 582 | 18 | 1667 | 3.0 | C |
| Comparative Example 7 | 5 | 100.0 | Repeated | 0 | 30 | 1000 | 5.0 | D |
| Comparative Example 8 | 5 | 10.0 | With idling | 570 | 30 | 1000 | 5.0 | C |
| Comparative Example 9 | 5 | 50.0 | Repeated | 0 | 60 | 500 | 10.0 | D |
| Comparative Example 10 | 5 | 10.0 | With idling | 540 | 60 | 500 | 10.0 | D |
| Comparative Example 11 | 1 | 10.0 | Repeated | 0 | 60 | 500 | 10.0 | B |
| Comparative Example 12 | 1 | 2.0 | With idling | 540 | 60 | 500 | 10.0 | C |

Figure 10A:
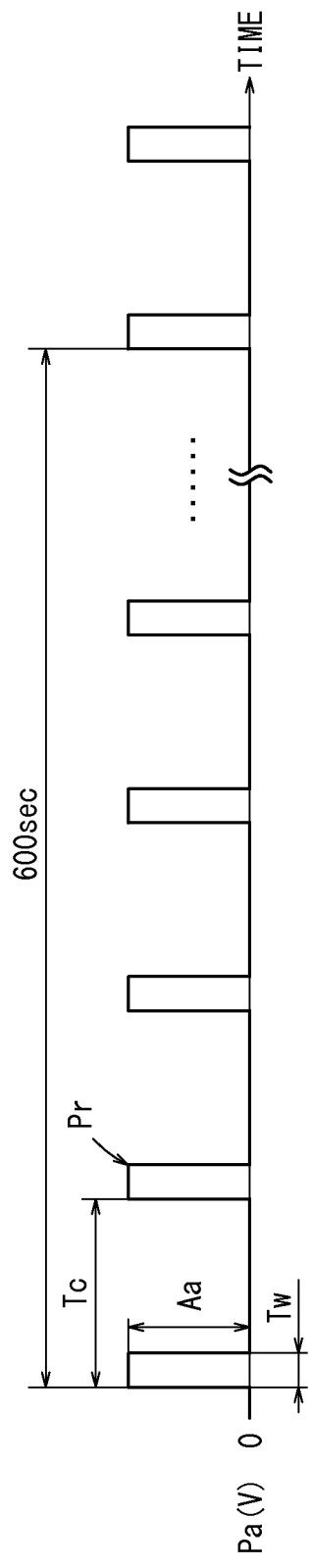
FIG. 10A is a waveform diagram showing a pulse signal Pa.

FIG. 10A should preferably have a pulse duration Tw of 3 msec. or shorter and a duty ratio (pulse duration Tw/pulse period Tc) of less than 10%.

Figure 10B:
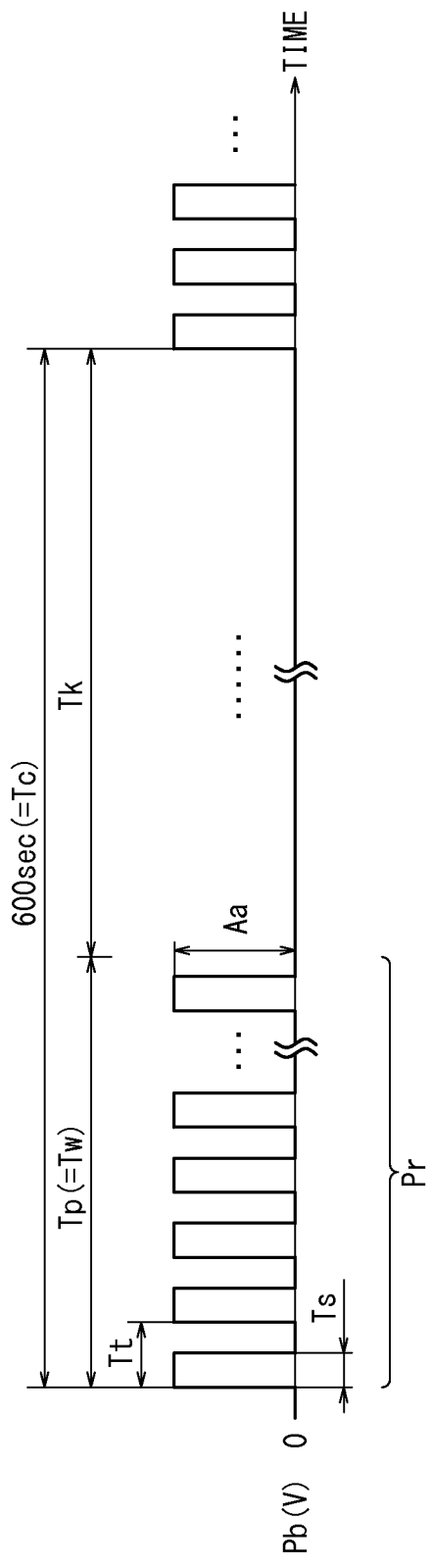
FIG. 10B is a waveform diagram showing a pulse signal Pb.

It can also be seen from the results of Inventive Examples 2, 4, 6, 8, and 10 that the pulse signal Pb shown in FIG. 10B should preferably have a pulse duration Tw of 3 msec. or shorter and a duty ratio (pulse train output period/600 seconds) of less than 10%.

The circuit board according to the present invention is not limited to the above embodiment, but may adopt various arrangements without departing from the scope of the invention.

The invention claimed is:

1. A circuit board having a plurality of metal interconnects disposed on an insulating base and a transparent adhesive layer disposed on the metal interconnects in direct contact with the metal interconnects, wherein
the metal interconnects include:
first metal interconnects to which a pulse signal is supplied; and
second metal interconnects to which a fixed potential is applied; and
the pulse signal has a pulse train of a plurality of pulses whose reference level is the same as the fixed potential and which have a pulse duration of 3 milliseconds or shorter, and an integrated time of the pulses during 600 seconds is less than 60 seconds.

2. The circuit board according to claim 1, wherein the metal interconnects contain at least one of silver and copper.

3. The circuit board according to claim 1, wherein the pulse signal has a signal form in which the pulse train is output at a constant pulse period repeated during 600 seconds, and has a duty ratio (pulse duration/pulse period) of less than 10%.

4. The circuit board according to claim 1, wherein the pulse signal has a pulse train output period in which the pulse train is output and an idle time in which the fixed potential is continuously output during 600 seconds; and
on condition it is assumed that 600 seconds represent a pulse period and the integrated time of the pulses of the pulse train represents a pulse duration, then the duty ratio (pulse duration/pulse period) is less than 10%.

5. The circuit board according to claim 1, wherein the transparent adhesive layer has a transparent adhesive made of at least one selected from a group consisting of a component A, a component B, and a component C, described below, which are optically transparent; and
on condition the transparent adhesive is 100 parts, then the transparent adhesive contains 45 to 95 parts of the component A, 20 to 50 parts of the component B, and 1 to 40 parts of the component C;
component A: An alkyl (meth)acrylate monomer whose glass transition temperature $T_g$ is 25° C. or lower (the alkyl group has 4 through 18 carbon atoms);
component B: An ester of (meth)acrylate monomer whose glass transition temperature $T_g$ is 25° C. or higher; and
component C: A monomer selected from a group of hydroxyalkyl (meth)acrylate, unsubstituted (meth)acrylamide, N-alkyl-substituted (meth)acrylamide, N,N-dialkyl-substituted (meth)acrylamide, a monomer having a urea functional group, and a monomer having a lactam functional group, a tertiary amine, an alicyclic amine, an aromatic amine, or a combination of these materials.

6. The circuit board according to claim 5, wherein the component A is at least one selected from a group consisting of n-butyl acrylate, 2-ethyl-hexyl (meth)acrylate, isooctyl acrylate, 2-methylhexyl acrylate, and a combination thereof.

7. The circuit board according to claim 5, wherein the component B is at least one selected from a group consisting of methyl (meth)acrylate, ethyl (meth)acrylate, isobornyl (meth)acrylate, and a combination thereof.

8. The circuit board according to claim 5, wherein the component C is at least one selected from a group consisting of 2-hydroxyethyl (meth)acrylate, 3-hydroxypropyl (meth)acrylate, N-octylacrylamide, N,N-dimethylacrylamide, N,N-diethylacrylamide, vinylpyridine, vinylimidazole, and N,N-dialkylaminoalkyl (meth)acrylate (the alkyl group has 1 through 4 carbon atoms).

9. The circuit board according to claim 5, wherein the component A is 2-ethyl-hexyl (meth)acrylate, the component B is isobornyl (meth)acrylate, and the component C is 2-hydroxyethyl (meth)acrylate.

10. The circuit board according to claim 5, wherein the transparent adhesive contains 50 to 65 parts of 2-ethyl-hexyl (meth)acrylate as the component A, 15 to 30 parts of isobornyl (meth)acrylate as the component B, and 20 to 30 parts of 2-hydroxyethyl (meth)acrylate as the component C.

11. The circuit board according to claim 5, wherein the component A is n-butyl acrylate and the component C is 2-hydroxyethyl (meth)acrylate.

* * * * *